(12) United States Patent
Epstein et al.

(10) Patent No.: US 8,293,140 B2
(45) Date of Patent: Oct. 23, 2012

(54) ALIGNED NANOSTRUCTURED POLYMERS

(75) Inventors: Arthur J. Epstein, Bexley, OH (US); Nan-Rong Chiou, Columbus, OH (US); Ly James Lee, Columbus, OH (US); Chunmeng Lu, Kearny, NJ (US)

(73) Assignee: The Ohio State University Research Foundation, Columbus, OH (US)

( * ) Notice: Subject to any disclaimer, the term of this patent is extended or adjusted under 35 U.S.C. 154(b) by 0 days.

(21) Appl. No.: 13/274,717

(22) Filed: Oct. 17, 2011

(65) Prior Publication Data

US 2012/0035353 A1  Feb. 9, 2012

Related U.S. Application Data

(60) Division of application No. 11/731,974, filed on Apr. 2, 2007, now Pat. No. 8,038,907, which is a continuation-in-part of application No. 11/168,751, filed on Jun. 28, 2005, now Pat. No. 7,374,703.

(60) Provisional application No. 60/788,609, filed on Apr. 3, 2006.

(51) Int. Cl.
  *H01B 1/00* (2006.01)
  *C07H 21/02* (2006.01)
  *C08G 73/00* (2006.01)

(52) U.S. Cl. ................. 252/500; 536/23.1; 528/422

(58) Field of Classification Search ........... 252/500; 536/23.1; 528/422
See application file for complete search history.

(56) References Cited

U.S. PATENT DOCUMENTS

| | | | |
|---|---|---|---|
| 5,217,650 | A | 6/1993 | Theophilou et al. |
| 5,792,830 | A | 8/1998 | Noding et al. |
| 6,030,551 | A | 2/2000 | Ho et al. |
| 6,509,502 | B1 | 1/2003 | Jussila et al. |
| 2005/0131139 | A1 | 6/2005 | Kaner et al. |
| 2007/0108055 | A1* | 5/2007 | Barron et al. ............. 204/455 |

OTHER PUBLICATIONS

Xu, L. et al., "Reversible Conversion of Conducting Polymer Films from Superhydrophobic to Superhydrophilic," Angew. Chem. Int., 44, pp. 6009-6012 (2005).*

Albarghouthi, M.N. et al., "Poly-N-hydroxyethylacylamide (polyDuramide): A novel, hydrophilic, self-coating op;lymer matrix for DNA sequencing by capillary electrophoresis," Electrophoresis, 23, pp. 1429-1440 (2002).*

S.Q. Jiao, et al., "Influence of the Preparation Conditions on the Morphology of Polyaniline Electrodeposited by the Pulse Galvanostatic Method," *Journal of Applied Polymer Science*, vol. 94, pp. 1389-1394 (2004).

Yangzin Zhou, et al., "Fabrication and electrical characterization of polyaniline-based nanofibers with diameter below 30 nm", *Applied Physics Letters*, vol. 83, No. 18, pp. 3800-3802, Nov. 3, 2003.

(Continued)

*Primary Examiner* — Mark Kopec
*Assistant Examiner* — Jaison Thomas
(74) *Attorney, Agent, or Firm* — Fay Sharpe LLP

(57) ABSTRACT

Novel, simple methods are presented directed to the synthesis of aligned nanofibers of polyaniline and substituted derivatives on a substrate. The production of these fibers is achieved via various methods by controlling the concentration of aniline monomer or substituted aniline derivatives or an oxidant in the reaction medium and maintaining said concentration at a level much lower than conventional polyaniline synthesis methods. Methods are disclosed relating to the use of a permeable membrane to control the release of a monomer and/or oxidant as well as a bulk polymerization method.

2 Claims, 16 Drawing Sheets

OTHER PUBLICATIONS

L. Liang, J. Liu, C.F. Windisch, G.J. Ezarhos, and Yuehe Lin, "Direct Assembly of Large Arrays of Oriented Conducting Polymer Nanowires", *Angew. Chem.*, 2002, 114, Nr. 19, pp. 3817-3820.

L. Liang, J. Liu, C.F. Windisch, G.J. Exarhos, and Yuehe Lin, "Direct Assembly of Large Arrays of Oriented Conducting Polymer Nanowires", *Angew. Chem. Int. Ed.*, 2002, 41, No. 19, pp. 3665-3668.

J. Liu et al., "Large arrays of oriented and molecularly aligned conductive polymer nanowires and their applications", *Chemistry—A European Journal.*, 2003, 9, No. 3, pp. 604-610.

Lin Pu, "Logic of Polyaniline Nanotubes", Advanced ScideaNews, Scidea Sketch, Published online: Feb. 28, 2007/ss20070129a1 http://www.scideanews.com.

\* cited by examiner

ALIGNED NANOSTRUCTURED POLYMERS

This application is a divisional of U.S. application Ser. No. 11/731,974, filed on Apr. 2, 2007 now U.S. Pat. No. 8,038,907, which is a continuation-in-part of U.S. application Ser. No. 11/168,751, filed on Jun. 28, 2005 now U.S. Pat. No. 7,374,703, and claims the benefit of U.S. Provisional Application No. 60/788,609, filed on Apr. 3, 2006.

BACKGROUND

The present exemplary embodiments relate to the synthesis of polyaniline and its substituted derivatives. It finds particular application in conjunction with the synthesis of aligned electrically conductive and non-conductive polyaniline nanofibers, and will be described with particular reference thereto. However, it is to be appreciated that the present exemplary embodiment is also amenable to other like applications.

Electroactive conductive polymers have been subject to extensive research in recent years. Polymers which show electrical conductivity due to the structure of the polymeric chain may be used to replace metal conductors and semiconductor materials in many applications. Significant applications include providing a conductive pathway in circuits and devices, displays, lighting, chemical, biological, environmental and medical sensors, anticorrosive coatings, scaffolds for tissue growth, antistatic shielding (ESD) and electromagnetic shielding (EMI).

In the group of intrinsically electrically conductive polymers, one technically promising polymer is polyaniline. Polyaniline has emerged as one of the most promising conducting polymers and can be used in a variety of applications, such as paint, antistatic protection, electromagnetic radiation protection, electro-optic devices such as liquid crystal devices (LCDs), light emissive displays, lighting and photocells, transducers, circuit boards, chemical, biological, environmental and medical sensors, anticorrosive coatings, scaffolds for tissue growth, etc.

Polyaniline is one of a class of conductive polymers, which can be synthesized through either chemical polymerization or electrochemical polymerization. Polyaniline is conventionally prepared by polymerizing an aniline monomer. The nitrogen atoms of monomer units are bonded to the para-carbon in the benzene ring of the next monomer unit. In chemical preparation, bulk polymerization is the most common method to make polyaniline. As has been previously reported, conventional bulk chemical synthesis produces granular polyaniline.

Thus, a variety of other chemical methods have been used in order to obtain polyaniline nanofibers. These approaches include use of templates or surfactants, electrospinning, coagulating media, interfacial polymerization, seeding, and oligomer-assisted polymerization. Among these methods, interfacial polymerization is perhaps the easiest and least expensive means to obtain nanofibers in one step. However, this method requires organic solvents to dissolve the aniline monomer, resulting in a waste stream that must be treated.

It is known that a thin film of polyaniline is deposited on substrates in the conventional polymerization of aniline, called in-situ adsorption polymerization. However, the deposited thin film prepared by the conventional chemical polymerization is only composed of irregular granular particulates. Until now, aligned and oriented nanostructures of polyaniline are generally produced in chemical or electrochemical polymerization through the assistance by hard templates. In the hard-template polymerization, polyaniline is confined to growth inside the channels of the membranes. After polymerization, the templates have to be removed or etched away carefully to obtain an oriented nanostructured thin film. The diameters of the aligned nanofibers are limited by the sizes of the pores of the template membranes used. Recently, a step-wise electrochemical deposition process was introduced to deposit oriented polyaniline nanofibers on the conductive substrates (e.g. Au, Pt etc.) without using a hard template. This method is limited by the substrates. It is necessary to use electrically conductive materials for substrates to obtain oriented nanostructures. For template or step-wise electrochemical deposition methods, a very large uniform array of aligned and oriented nanostructures is generally not possible to fabricate (e.g. a letter sized substrate, 8.5 inches× 11 inches). Those limitations restrict the applicability of the aligned nanofibers, especially for use in surface response (e.g., superhydrophobic or superhydrophilic surfaces), electrodes for organic or polymeric light-emitting diodes, field emission display, DNA stretching, chemical sensors, biosensors etc.

Therefore, there is an interest in devising an easy, inexpensive, environmentally friendly and scalable one-step method to produce highly pure, uniform nanofibers with controllable average diameters ranging from 5 nm to 250 nm in bulk quantities to meet the requirements for potential use on cell culture, electronic devices, sensors, biosensors, supercapacitors, hydrogen storage, etc.

INCORPORATION BY REFERENCE

The disclosures of U.S. application Ser. No. 11/731,974, filed on Apr. 2, 2007, U.S. application Ser. No. 11/168,751, filed on Jun. 28, 2005, and U.S. Provisional Application No. 60/788,609, filed on Apr. 3, 2006, are each incorporated herein by reference in their entirety.

BRIEF DESCRIPTION

In a first aspect, there is provided a process for Application No. forming aligned nanofibers of polyaniline or a substituted polyaniline on a substrate including the steps of: providing a first solution containing aniline monomer or substituted aniline monomer; providing a second solution containing an oxidant, wherein at least one of the first and second solutions further contains an acid; providing a permeable membrane separating the first and second solutions, wherein the membrane permits at least one of the monomer and th

BRIEF DESCRIPTION

In a first aspect, there is provided a process for forming aligned nanofibers of polyaniline or a substituted polyaniline on a substrate including the steps of: providing a first solution containing aniline monomer or substituted aniline monomer; providing a second solution containing an oxidant, wherein at least one of the first and second solutions further contains an acid; providing a permeable membrane separating the first and second solutions, wherein the membrane permits at least one of the monomer and the oxidant to pass therethrough at a controlled rate; allowing at least one of the monomer and the oxidant to pass through the membrane to form a reaction solution of monomer and oxidant; providing a substrate; and polymerizing monomer in the reaction solution to form aligned polymer nanofibers on a surface of the substrate.

In a second embodiment, aligned polyaniline nanofibers can be obtained from conventional bulk chemical polymerization under careful control of polymerization conditions. This is accomplished by introducing aniline monomer solution into an oxidant solution (or vice versa) and polymerizing at low concentrations and depositing said aligned nanofibers on a substrate.

In a third embodiment, there are provided various applications of aligned polyaniline fibers deposited on a substrate.

BRIEF DESCRIPTION OF THE DRAWINGS

FIG. 8(A)-(C) are scanning electron micrographs (SEMs) of polyaniline nanofibers deposited on a Si-wafer substrate with a thin layer coating of Au/Pd. (A) Low magnification, ×100; scale bar=200 μm (B) High magnification, ×20,000; scale bar=1 μm (C) Isolated single nanofibers; magnification, ×10,000; scale bar=2 μm).

DETAILED DESCRIPTION

Figure 1:
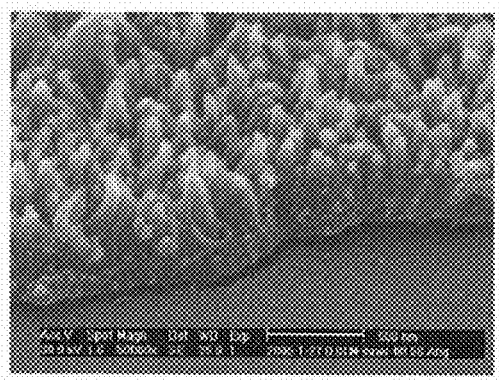
FIG. 1 shows the nanostructure of sulfite ion functionalized polyaniline fibers both before and after nucleophilic addition.
Figure 1:
Figure 1:
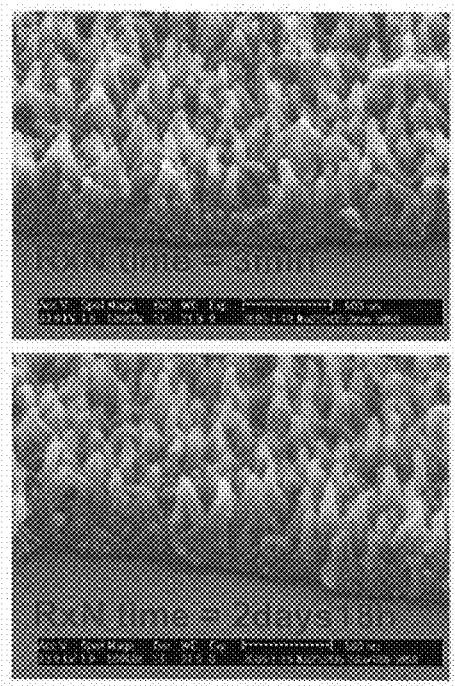

As stated above, the present exemplary embodiments are directed to the synthesis of aligned polyaniline nanofibers. According to the classical theory of nucleation and growth, the mechanism of nucleation followed by growth is responsible for polyaniline morphology. An elongated form (e.g., fibers, tubes or rods) is established as the growth rate for polyaniline is distinctly not identical in all directions (anisotropic growth). Moreover, new active nucleation centers can occur on initially formed nanofibrils for additional growth of nanofibrils resulting in a branched network or dendrites (secondary nucleation). If reduced concentrations of monomer and/or oxidant are used or the concentrations of monomer and/or oxidant are careful controlled in the initial stage of polymerization, polyaniline may form in favor of 1-D nanostructures exclusively. Following this route, two novel, facile methods are introduced to synthesize polyaniline nanofibers.

In the parent application, two approaches were introduced to synthesize polyaniline nanofibers in an aqueous solution without aid of specific templates, such as surfactants, large organic dopant acids, organic solvents, nanoscale seeds, oligomers, etc. In the first approach (called dilute polymerization), polymerization needs to be carried out in dilute aniline in the presence of the protonic acid. This contrasts with the relatively high concentrations of aniline used to synthesize polyaniline powders in conventional polymerization methods. The term "dilute aniline" is used here to describe the polymerization of aniline being carried out at a substantially lower concentration of aniline, e.g. less than ~0.015M, compared to the one used in the conventional synthesis, e.g. ~0.435M of aniline. In addition, the molar ratio of aniline to oxidant in the dilute polymerization process is in the range of 10:1 to 0.1:1. This contrasts to the fixed molar ratio of aniline to oxidant of 4.35:1 in the conventional synthesis.

In the second approach (called porous membrane controlled polymerization), a permeable tubing or membrane is used to steadily control the release of aniline monomer into an oxidant solution (or vice versa) in the protonic acid media to form polyaniline nanostructures. After polymerization, polyaniline nanofibers are collected directly outside the tubing or inside the tubing without any further treatment to obtain free-standing nanofibers.

It has now been determined that In addition to the nanofibers formed in the bulk solution, aligned and molecularly ordered polyaniline nanofibers (or nanowires) also can be formed simultaneously on any substrates (e.g. the wall of the beaker, the interface between air and reaction solution, solid materials, stirring magnetic bar, etc.) present in the reaction mixture using either of the above dilute polymerization or porous membrane controlled polymerization processes.

The present embodiments show the ability to successfully coat aligned and oriented nanofibers (or nanowires) of polyaniline and its derivatives on a variety of sized substrates (e.g. submicron PET fibers up to a letter sized over-head transparency) using the novel, two methods, dilute polymerization and porous membrane controlled polymerization. There is no apparent difference in the coating morphology of the aligned nanofibers on either conductive (e.g. ITO) or inert substrates (PET, PMMA, PS, PDMS, etc.) for these two methods. In addition, the geometry (e.g. flat or hierarchical surfaces) of the substrates has no effect on the coating. This shows that the two methods we propose are very robust and this also leads to broad application of this aligned and oriented nanostructure.

The production of these aligned fibers is achieved via various methods by introducing a substrate while controlling the concentration of aniline monomer or an oxidant in the reaction medium and maintaining said concentration at a level much lower than conventional polyaniline synthesis methods. Although not intended to be limiting, excellent results are achieved with a concentration of monomer in a reaction solution of 10 millimoles or less. This control can be accomplished by various methods.

In a first embodiment, termed "porous membrane controlled polymerization" as described above, aniline monomer dissolved in an aqueous acid solution is separated from an aqueous oxidant/acid solution by a permeable membrane in a reaction chamber containing a substrate. The aniline monomer diffuses through the membrane at a controlled rate and is subsequently polymerized in the oxidant/acid solution according to known reactions. Alternately or in addition to diffusion of the aniline monomer, the oxidant can diffuse through the membrane. Polyaniline nanofibers will form and then precipitate out of aniline and oxidant solution onto the substrate and may be subsequently collected. The polymer is deposited on the substrate as aligned nanofibers having diameters ranging from 5 nm to 250 nm or more, more preferably 5 to 60 nm.

Suitable substrates include non-conductive and/or conductive substrates. Preferred non-conductive substrates include e.g., poly(ethylene terephthalate) (PET), poly(methyl methacrylate) (PMMA), polystyrene (PS), poly(dimethyl siloxane) (PDMS), Teflon®, Tyvek®, Kapton® polyimide film, polyimide (PI), Polyethylene (PE), Polyurethane (PU), filter paper, quartz, and glass. Preferred conductive substrates include e.g., ITO, Pt, Au, Au coated glass, Stainless steel and Si wafer.

The permeable membrane may be any membrane through which the aniline monomer and/or oxidant can diffuse or otherwise pass through. Thus, various types of cellulose or other finely porous materials may be used as the membrane. Useful membranes may thus be made from, for example, regenerated cellulose, cellulose ester, or polyvinyldiene difluoride. The arrangement of the membrane can vary depending on the size, shape, etc. of the reaction chamber, with the only provision being that it must separate the monomer from the oxidant.

In one specific embodiment, applicants have found that conventional regenerated cellulose dialysis tubing provides excellent results in that it adequately controls the diffusion of monomer(s) or oxidant(s) to enable the production of extremely fine polyaniline nanofibers. Thus, in this embodiment, aniline monomer in solution is placed in dialysis tubing, which is then sealed. The sealed tubing is then placed in a reaction chamber (such as a beaker) containing an oxidant in an acid solution and a substrate onto which aligned polymer fibers will deposit. Alternately, the oxidant may be placed in the tubing with the aniline monomer in the reaction chamber.

In this embodiment, the pore size of the dialysis tubing may be changed to control the rate of diffusion of the aniline and/or the oxidant and thus its concentration in the reaction chamber. This control can be used to customize the size and configuration of the resulting polyaniline nanofibers, as described below. Applicants have found that a regenerated cellulose membrane (or tubing) with a molecular weight cut off (MWCO) of about 3500 to 60,000 provides excellent results. Nevertheless, other membranes with larger or smaller pore sizes may be used. Thus, cellulose ester membranes with MWCO of from 100 to 300,000 or polyvinyldiene difluoride membranes with MWCO of from 250,000 to 1,000,000 are also suitable exemplary materials.

Polyaniline produced according to the process of this invention may be prepared from the polymerization of unsubstituted aniline or a substituted aniline monomer. In addition, dimers as well as oligomers having up to eight repeating aniline or substituted aniline units may also be used in the various embodiments. As used herein, any general description using the terms "aniline" is intended to refer to and encompass both substituted and unsubstituted aniline monomer, as well as dimers or oligomers thereof of up to eight units in length. Likewise, the term "polyaniline" is also intended to refer to and encompass polymers of both substituted and unsubstituted anilines, including copolymers thereof, unless specifically noted.

Exemplary substituted aniline monomers include those having the following formula:

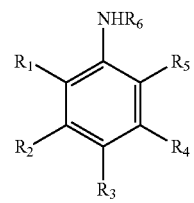

wherein, $R_1$, $R_2$, $R_3$, $R_4$, $R_5$, and $R_6$ are independently selected from the group consisting of: hydrogen atom, alkyl, alkoxy, alkylsulfonyl, arylsulfonyl, halogen, alkoxycarbonyl, alkylthio, alkylsulfuryl, cycloalkyl, sulfonic, aryl or carboxylic substituted alkyl substituents.

Specific substituted anilines that may be amenable to the present processes include 2-aminobenzenesulfonic acid, 3-aminobenzenesulfonic acid, orthanilic acid, o-toluidine, m-toluidine, o-anisidine, m-anisidine, as well as polyhalogen anilines such as 2-fluoroaniline, 2-chloroaniline, 2-bromoaniline, 2-iodoaniline, 3-fluoroaniline, 3-chloroaniline, 3-bromoaniline, and 3-iodoaniline. In addition, it may be possible to use other monomers by modifying the disclosed processes including, for example, pyrrole, substituted pyrrole, thiophene, substituted thiophene and 3,4-ethylenedioxythiophene as well as the use of two or more monomers to produce a copolymer, such as aniline/pyrrole, aniline/toluidine or aniline/anisidine. Specific nanofibers of both poly(-o-toluidine) and sulfonated polyaniline were successfully produced using the present processes.

In an aqueous polymerization medium, any conventional protonic acid or mixtures thereof may be used in the present embodiments. Both inorganic and organic acids may be used including chiral acids. Such acids for use in the polymerization of aniline are known and include, but are not limited to, protonic acids which can be used to form a complex with the aniline monomer and to make it possible for the aniline monomer to be dissolved in water. Exemplary acids include hydrochloric acid, hydrogen bromide, sulfuric acid, perchloric acid, nitric acid, phosphoric acid, phosphonic acid, trifluoromethanesulphonic acid, toluenesulphonic acid, dodecylbenzenesulphonic acid (DBSA), acetic acid, p-toluenesulfonic acid (p-TSA), trichloroacetic acid, trifluoroacetic acid, formic acid, (1R)-(−)-10-camphorsulfonic acid, (1S)-(+)-10-camphorsulfonic acid (CSA), 2-acrylamido-2-methyl-1-propanesulfonic acid (AMPSA), and methanesulfonic acid ($CH_3SO_3H$), carboxylic acids, etc. It is also possible to use a mixture of these protonic acids. Also Lewis acids can be used. The invention is not limited to the use of the above-mentioned acids.

The oxidative agent used in the process according to the present embodiments may be any conventional oxidizer used in the polymerization of aniline. Exemplary oxidizing agents include ammonium peroxydisulfate (APS), persulfated salts such as, sodium persulfate and potassium persulfate, perchlorated salts such as potassium perchlorate, chlorinated salt such as potassium chlorinate, iodonated salt such as potassium iodonate, chlorinated iron such as ferric chloride, halogenated metal acids such as chloroaurate acid, fuming sulfuric acid, and ozone. Preferred oxidants include APS, $K_2Cr_2O_7$, $KlO_3$, $FeCl_3$, $KMnO_4$, $KBrO_3$, $KClO_3$, peracetic acid or hydrogen peroxide. The reduced oxidant may remain in the resulting polymer nanofibers, as for example, iron or gold nanoparticles.

The polymerization temperature in the process of the present embodiments may vary within a range from about −15 to 60° C. Similarly, the pH of the reaction solution is preferably maintained at a pH value of below about 1. However, nanofibers can also be produced at a pH value of 1 or above.

As detailed above, the membrane is used to steadily control the release of aniline and/or oxidant into the other solution to form polyaniline nanostructures. In conventional bulk polymerization methods, the aniline monomer is typically present in the reaction solution at a molar concentration of about 0.3 to 0.6. In the specific embodiments herein wherein the aniline diffuses through the membrane to react with the oxidant (thus making the oxidant solution the site of the reaction), there may be a much lower concentration of aniline in the reaction solution, for example on the order of about 0.001 to about 0.01 M, preferably about 0.008 M. Alternately, if the oxidant is the species that diffuses through the membrane (thereby making the aniline solution the site of reaction), then the concentration of oxidant in the reaction solution may fall within the above ranges.

This low concentration is achieved in these embodiments by the slow diffusion of aniline (or oxidant) across the membrane. Aniline can be used directly or dissolved in any acid solutions or in any organic solvents with any concentrations. In the embodiment below, this low concentration is achieved by the introduction of much smaller amounts of aniline into the reaction chamber. The amount of oxidant initially present in solution prior to polymerization relative to the amount of aniline initially present in solution is not critical, but applicants have found that a preferred molar ratio of aniline to oxidant is 1:1. It has been found that stirring or otherwise agitating the reaction mixture during polymerization may be desirable in some instances to produce nanofibers having specific characteristics.

In the first embodiment the characteristics of the resulting polymer nanofibers (including diameter and morphology) can be controlled to a certain degree by the selection of acid to be added to the reaction mixture as well as the temperature at which the polymerization is carried out and the inclusion of a surfactant.

In the first embodiment suitable surfactants that may be used in the reaction system include anion surfactants such as sodium dodecylsulfate, cation surfactants such as dodecyltrimethylammoniumbromide, and nonionic surfactants such as Triton® X-100. When included, the concentration of surfactant in the reaction mixture may range from, e.g., 0.0001 M to 1 M.

The resulting doped polymer can be dedoped with a base to produce a non-electrically conductive polyaniline product (emeraldine base) with electrical conductivity less then $10^{-5}$ S/cm, which can be re-doped with a suitable acid to produce an electroconductive polymer with the desired properties. By this dedoping and redoping process, it is possible to control the electro-conductive properties of the polymer nanofibers continuously over the full range from that of an electrical insulator (conductivity $<10^{-10}$ S/cm) to that of a semiconductor (conductivity $\sim 10^{-5}$ S/cm) to that of a good conductor of electricity (conductivity $\sim 1$ S/cm) to that of a metal (conductivity $>10^2$ S/cm).

In a second embodiment, the "dilute polymerization process" described above, bulk polymerization of aniline or substituted aniline monomer is conducted at very low concentration of aniline monomer. This is accomplished by introducing aniline monomer solution into an oxidant solution (or vice versa) and polymerizing at very low concentrations. Suitable concentrations may be tens of millimoles or lower and preferably from 0.001 to 0.01 M. Applicants have found that this low concentration allows the production of polyaniline nanofibers. Applicants have found that this low concentration coupled with the effect of minimal or not stirring or agitating the reaction mixture during the polymerization, allows the production of polyaniline nanofibers of increased length. However, it has been found that stirring or otherwise agitating the reaction mixture during polymerization may be desirable in some instances to produce nanofibers having specific characteristics.

In this second embodiment, a typical bulk polymerization reaction apparatus may be used. This typically consists of a reaction chamber, which in its simplest form may be a beaker.

An aqueous solution of protonic acid, oxidant(s) and, if necessary, other agents are added into the reaction chamber. A substrate is included in the reaction container onto which aligned polymer fibers are deposited. Oxidant(s) can be dissolved in an acid solution for example in the mixing tank. A commonly used oxidant is ammonium peroxydisulfate (APS). Also other oxidants can be used. Protonic acid makes the polymerizing medium acidic, thereby making the polymerization reaction possible. Protonic acid also acts as a so-called dopant which donates the counter anion and forms a salt with the polyaniline base. Suitable acids are described above.

The actual polymerization takes place by feeding monomer(s), e.g. aniline into the process. Dissolved into a suitable medium, such as an aqueous acid solution, aniline is supplied to the reaction chamber. Depending on the temperature of the reaction mixture, the polymerization takes place over the course of several hours. While stirring is typically used in the polymerization of aniline and can be performed in the present process, applicants have found that longer and less branched fibers are possible if the mixture is subjected to minimal stirring or otherwise not agitated. Polymerized aniline precipitates and is deposited on the substrate, which can then be collected and purified.

The amount of oxidant initially present in the reaction solution prior to polymerization relative to the amount of aniline initially present in the reaction solution is not critical, with the initial molar ratio of aniline to oxidant ranging from 50:1 or greater down to 0.02:1. More preferred molar ratios are from 10:1 to 0.1:1 and even 4:1 to 1:1. A particularly suitable molar ratio of aniline to oxidant is 1.5:1.

In the second embodiment the characteristics of the resulting polymer nanofibers (including diameter and morphology) can be controlled to a certain degree by the selection of acid to be added to the reaction mixture as well as the temperature at which the polymerization is carried out and the inclusion of a surfactant.

In the second embodiment suitable surfactants that may be used in the reaction system include anion surfactants such as sodium dodecylsulfate, cation surfactants such as cetyltrimethylammoniumbromide, and nonionic surfactants such as Triton® X-100. When included, the concentration of surfactant in the reaction mixture may range from, e.g., 0.0001M to 1 M.

Functionalized polyaniline can likewise be produced by modifying the molecular structure of polyaniline after polymerization without changing the nanostructure of the aligned fibers. Thus, nucleophilic addition of the sulfite ion (—$SO_3^-$) to the polyaniline fibers can be made by adding fuming sulfuric acid to the polymer via the following reaction:

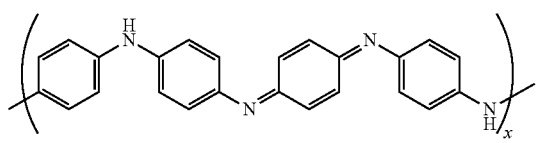

1. Fuming sulfuric acid ($SO_{3(g)}$)
2. Nucleophilic addition (sulfite, —$SO_3^-$)

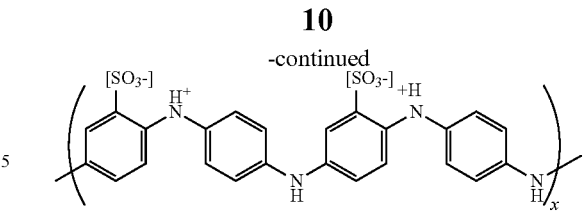

FIG. 1 shows the nanostructure of such fibers both before and after nucleophilic addition.

Figure 2:
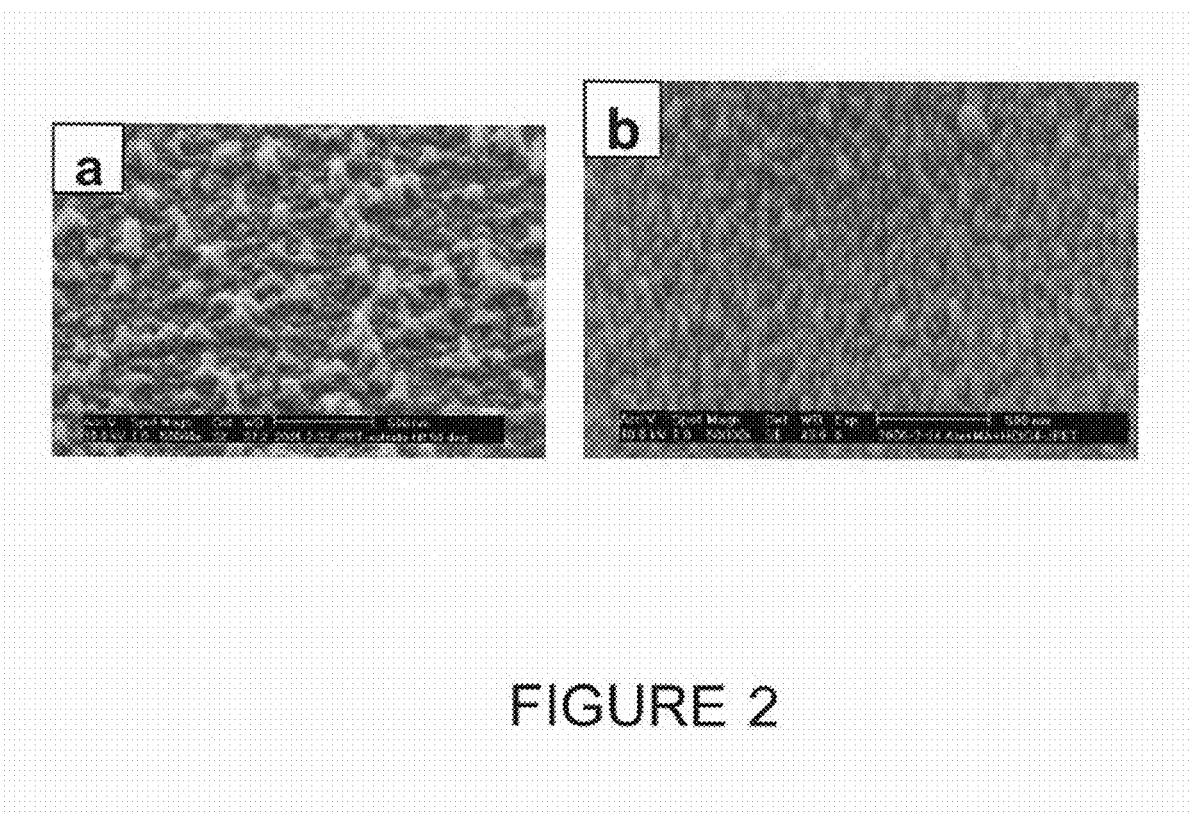
FIG. 2 shows SEM images for sulfonated polyaniline synthesized from different concentrations of the monomers (aniline and 3-aminobenzenesulfonic acid).

Aligned and oriented copolymers, e.g. sulfonanted polyaniline, can also be synthesized via our proposed two methods. FIG. 2 shows SEM images for sulfonanted polyaniline synthesized from different concentration of the monomers (aniline and 3-aminobenzenesulfonic acid). The density of aligned nanofibers deposited on the substrate can be controlled through the concentration of monomers.

The polymer nanofiber networks so made can be used for chemical, biological, environmental or medical sensors as well as the active channel of a field effect device.

The following examples are provided for purposes of describing the preferred embodiments. They should not be considered limiting of the invention.

EXPERIMENTAL

Reagents

Aniline (Aldrich) and pyrrole (Aldrich) were distilled under vacuum before use. Ammonium peroxydisulfate (APS; 99.99%, Aldrich), deionized water, and dopant acids were used directly as received without further purification. Spectra/Por Dialysis Tubing, Regenerated Cellulose (MWCO 3500, MWCO 12k-14k, MWCO 15K, MWCO 25K, and MWCO 60K) and Spectra/Por Closures were purchased from Spectrum Laboratories, Inc.

A variety of inorganic/organic dopant acids were used to study the formation of polyaniline nanofibers in the dilute polymerization and porous membrane controlled polymerization, including hydrochloric acid (HCl), sulfuric acid ($H_2SO_4$), perchloric acid ($HClO_4$), phosphoric acid ($H_3PO_4$), 2-acrylamido-2-methyl-1-propanesulfonic acid (AMPSA), p-toluenesulfonic acid (p-TSA), (1S)-(+)-10-camphorsulfonic acid (CSA), methanesulfonic acid ($CH_3SO_3H$), nitric acid ($HNO_3$), etc.

Substrates included Si-wafer, PET film and ITO coated glass. Polyethylene terephthalate over-head transparency film (JPET; University of Yamanashi, Collage Bookstore, Japan) were used with/without acetone treatment. Tissue paper with acetone was used to remove the surface coating of JPET by gentle wiping in one direction. A glass coated with ITO and other types of substrates were cleaned by sonication in RBS solution (10 ml of concentrated RBS-38, 5 ml of ethanol and 485 ml of deionized water) for at least 30 minutes and then rinsed by a plenty of deionized water before use.

Example 1

Dilute Polymerization Trials

Aniline was dissolved in predetermined amounts in 1M dopant acid solution, and carefully transferred to a solution of ammonium peroxydisulfate (APS) dissolved in 1M dopant acid solution in beakers. The reaction was carried out at various temperatures (room temperature, 0-5° C. in an ice bath, 12-14° C. in a freezer) both with and without disturbance (e.g. stirring). After 24 hours, the dark-green polyaniline precipitate was collected either by dialysis tubing (MWCO 12k-14k), and then purified by dialysis with deionized water or using a Buchner funnel with a water aspirator and then purifying portionwise with deionized water until the filtrate became colorless. Trials were conducted using various concentrations of aniline to study the formation of polyaniline nanofibers, ranging from 8 mM to 128 mM. The molar ratio of aniline and APS was also varied from 4.35:1 to 1:1. A variety of acids were used as detailed above. 0.2 M to 1.2 M of dopant acids were used to study formation of nanofibers.

Example 2

Porous Membrane Controlled Polymerization Trials regenerated cellulose dialysis tubing with molecular weight cut-off (MWCO) 3,500 (Spectra/Por 3, Spectrum Laboratories, Inc.) was used as a permeable membrane, aniline as a monomer, ammonium persulfate as an oxidant and various inorganic/organic acids as dopant acids. Aniline was dissolved in 12 mL of 1M dopant acid solution, and carefully transferred to dialysis tubing (MWCO 3500) sealed with Spectra/Por Closures. The sealed dialysis tubing was put into a 600 mL beaker with a solution of ammonium peroxydisulfate dissolved in 500 mL of 1M dopant acid solution. The reaction was carried out at room temperature and at a temperature 0-5° C. (ice bath) both without any disturbance as well as with stirring. After 24 hours, the precipitated dark-green polyaniline outside the dialysis tubing was collected and purified using the same procedures as mentioned in the dilute polymerization. Trials were conducted using various concentrations of aniline to study the formation of polyaniline nanofibers, ranging from 8 mM to 128 mM.

As an illustrative case, we chose regenerated cellulose dialysis tubing with molecular weight cut-off (MWCO) 3,500 (Spectra/Por 3, Spectrum Laboratories, Inc.) as a permeable membrane, aniline (Aldrich) distilled under vacuum as a monomer, ammonium persulfate (($NH_4$)$_2S_2O_8$, APS; 99.99%, Aldrich) as an oxidant and perchloric acid ($HClO_4$; 70%, GFS Chemicals) as a dopant acid. Aniline (4.025 mmole) was dissolved in 12 mL of 1M $HClO_4$ solution, and carefully transferred to dialysis tubing (MWCO 3500) sealed with Spectra/Por Closures. The sealed dialysis tubing was put into the 600 mL beaker with the solution of ammonium peroxydisulfate (4.025 mmole) dissolved in 500 mL of 1M $HClO_4$ solution. The reaction was carried out at temperature 0-5° C. (ice bath) without any disturbance. After 24 hours, the precipitated dark-green polyaniline outside the dialysis tubing was collected and purified by dialysis against deionized water (Dialysis Tubing, MWCO 12k-14k).

In both the Dilute Polymerization trials and the Porous Membrane Controlled Polymerization Trials, the doped polyaniline nanofibers or samples prepared here were dedoped by dialysis with 0.1 M $NH_4OH_{(aq)}$, and then redoped by dialysis with 0.5M or 1M $HCl_{(aq)}$. It is noted that any kind of acid as mentioned above can be used to dope or redope nanofibers and a basic solution (e.g. $NH_4OH_{(aq)}$, NaOH, etc.) can be used to dedope the nanofibers.

Characterization and Results

Samples deposited onto Si-wafer substrates and then sputtered with a thin layer of Au/Pd or Au were used for scanning electron microscopy (SEM, Philips XL-30 ESEM) studies. Samples dispersed in deionized water were transferred to copper grids for transmission electron microscopy (TEM, Philips CM-200 or Philips TF-20). UV/vis absorption was studied using a UV/VIS/NIR Spectrometer (PERKIN ELMER Lambda 19) employing the polyaniline dispersions in deionized water. Samples dispersed in deionized water were transferred to Rigaku glass powder holder for the study of X-ray diffraction. X-ray patterns were taken with CuKα radiation ($\lambda$=1.52 Å).

Dilute Polymerization

Figure 3:
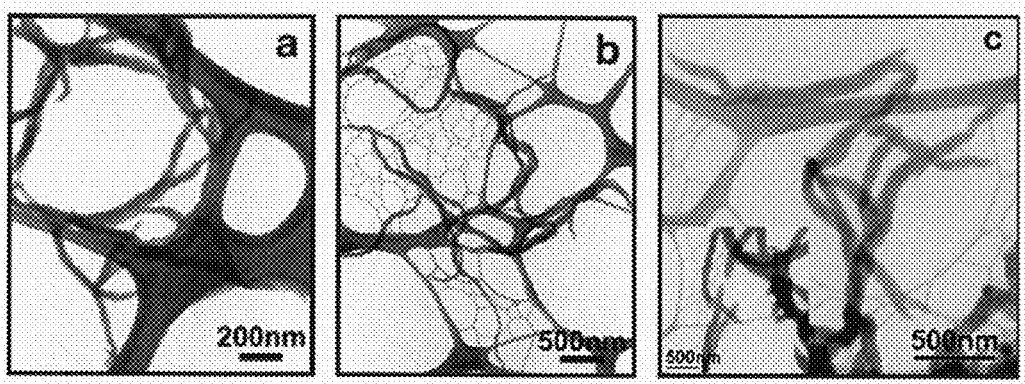
FIG. 3 is a transmission electron micrograph (TEM) of polyaniline nanofibers obtained in different dopant acids (a) CSA (b) $CH_3SO_3H$ (c) $HClO_4$, with the inset image showing a different area with nanofibers of larger diameters.
Figure 4:
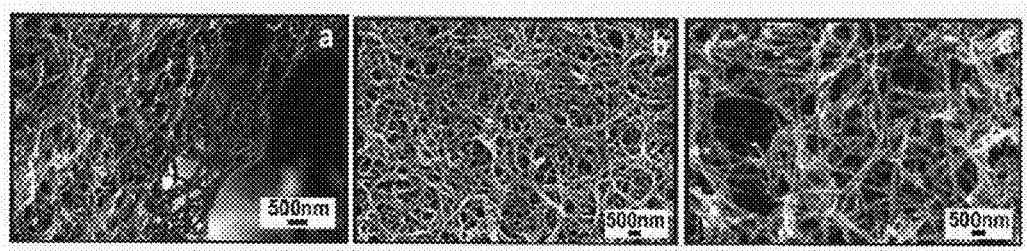
FIG. 4 is Scanning electron micrograph (SEM) of polyaniline nanofibers obtained from different dopant acids (a) camphor sulfonic acid (CSA) (b) $CH_3SO_3H$ (c) $HClO_4$.

Typical TEM and SEM images obtained demonstrate the nanofibrous structures of polyaniline as shown in FIG. 3 and FIG. 4, respectively. As long as polymerizations are performed using dilute aniline, nanofibers are formed regardless of which acids are used, including those mentioned in the experimental section. Polyaniline nanofibers produced with different acids show similar nanofiber structures of interconnected networks. However, different types of acids can produce polyaniline nanofibers with different diameters. As shown in FIG. 3(a), polyaniline nanofibers obtained from $CSA_{(aq)}$ present smaller diameters of 17-50 nm. The diameters of polyaniline nanofibers synthesized in $CH_3SO_3H_{(aq)}$ range from 42 nm to 70 nm as shown in FIG. 3(b). In addition, FIG. 3(c) shows larger diameters of polyaniline nanofibers obtained from $HClO_{(aq)}$ varying from 72 nm to 250 nm. The diameters of nanofibers described here are based on multiple statistical TEM measurements on different areas. Nanofiber morphology for each of the acids used is reproducible for the same synthesis conditions, such as concentration, temperature, etc. This indicates that the diameters of polyaniline nanofibers can be controlled directly by the appropriate selection of dopant acids. In addition, nanofibers obtained from different dopant acids all show similar range of lengths up to several micrometers.

The morphology of doped nanofibers does not significant change when dedoped and redoped multiple times by 0.1M $NH_4OH_{(aq)}$ and 1M dopant acids, respectively. However, the nanofibrous structures are deformed or broken into fragments of small pieces under high-pressure mechanical stress, e.g. 2500 KPa, or an intense ultrasonic bath. Polyaniline nanofibers obtained in dilute aniline are easily dispersed in deionized water, methanol, ethanol or toluene etc., and the resulting suspensions are stable for several minutes, followed by agglomeration and precipitation. The suspension increases the processibility of polyaniline nanofibers. For example, one can use the suspension of nanofibers to cast a thick film, ~10 μm, on a substrate and then immerse it into electrolyte solutions or solvents. Surprisingly, the thick film is stable in the solutions or solvents for more than one day without any dissolution. This may reflect the strong interaction and the highly entangled aggregation among the nanofiber networks as shown in SEM images (FIG. 4).

Figure 5:
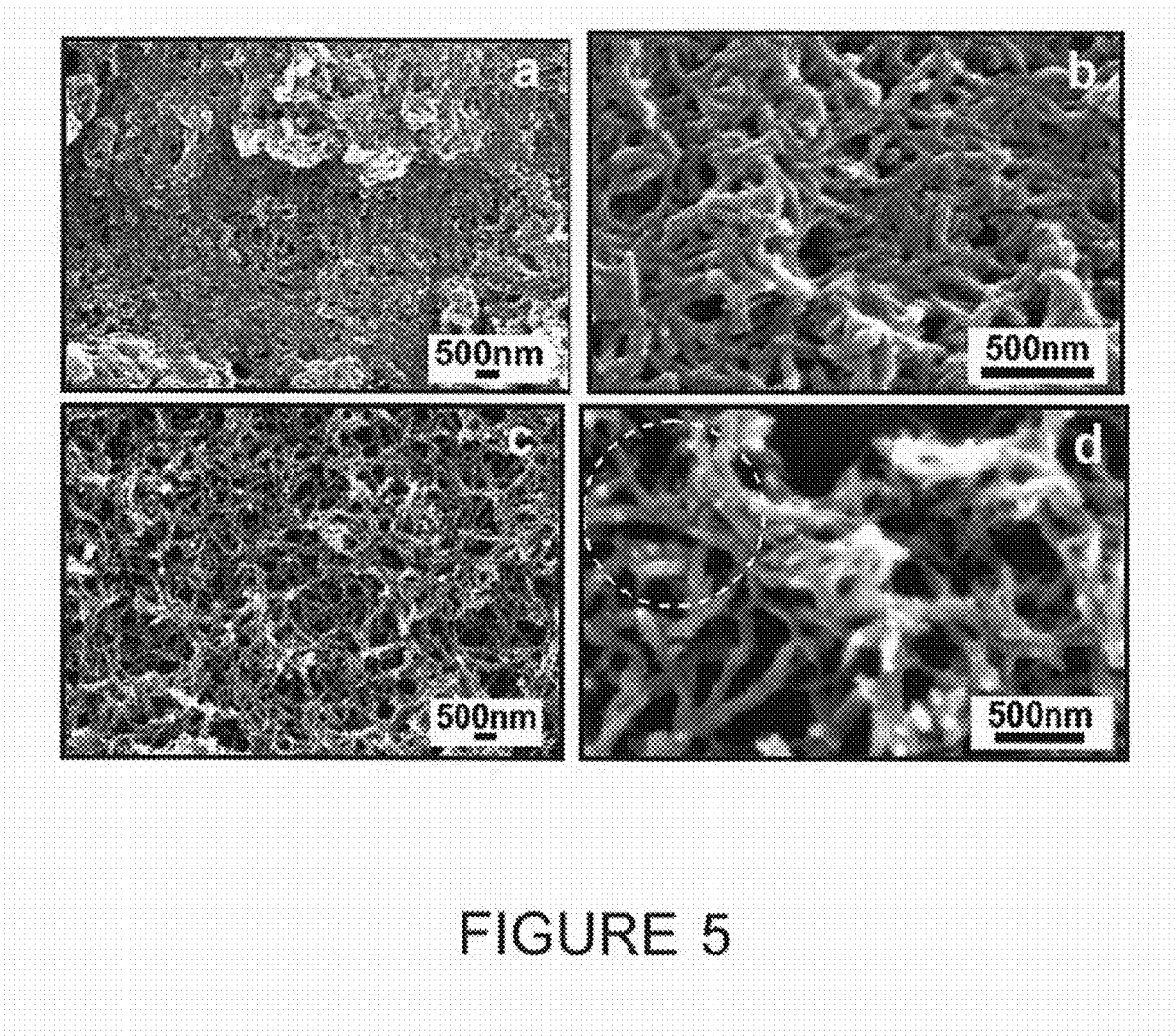
FIG. 5 shows a scanning electron micrograph (SEM) of polyaniline nanofibers obtained in 1M $HCl_{(aq)}$. (a)-(b) conventional polymerization: [aniline]=0.4M, (c)-(d) dilute polymerization: [aniline]=0.008M.

FIG. 5 shows a scanning electron micrograph (SEM) of polyaniline nanofibers obtained in 1M $HCl_{(aq)}$, wherein (a)-(b) show fibers produced via conventional polymerization wherein [aniline]=0.4M, and (c)-(d) show fibers produced via dilute polymerization wherein [aniline]=0.008M. The white spots in the dashed circle in (d) may correspond to surface active sites for nucleation.

The formation mechanism of polyaniline nanofibers remains unclear. It is suggested that the growth of nanofibers is intrinsic to the polymerization of aniline because it is observed even during synthesis with a relatively high concentration of aniline (SEM image, FIG. 5(a)-5(b)). However, in contrast to polymerization in a dilute solution (FIG. 5(c)-5(d)), for polymerization in concentrated solution the individual polyaniline nanofibers pack very densely and merge with each other as shown in FIG. 5(b). According to classical nucleation theory, the nanofibers formed initially may serve as nucleation sites for additional nanofibers (secondary nucleation). We observe small white spots on the nanofiber surfaces, e.g. FIG. 5(d) within the dashed circle, which are associated with asperities along the fibers. These may act as surface active sites for nucleation.

Although not intended to be bound by any theory, it is believed that the formation of interconnected, branched nanofiber networks may be explained as follows: In the event of high aniline concentration in solution, a competition between directional fiber growth process and formation of additional nucleation centers is taking place. Once a high density of nucleation centers is generated, the interfacial energy between the reaction solution and nanofibers may be minimized and hence rapid precipitation occurs, in a disordered manner, yielding irregular shapes. In a dilute solution the number of nucleation sites formed on the surface of the nanofibers may be reduced, thus allowing polyaniline to grow only in a one-dimensional morphology.

Figure 6:
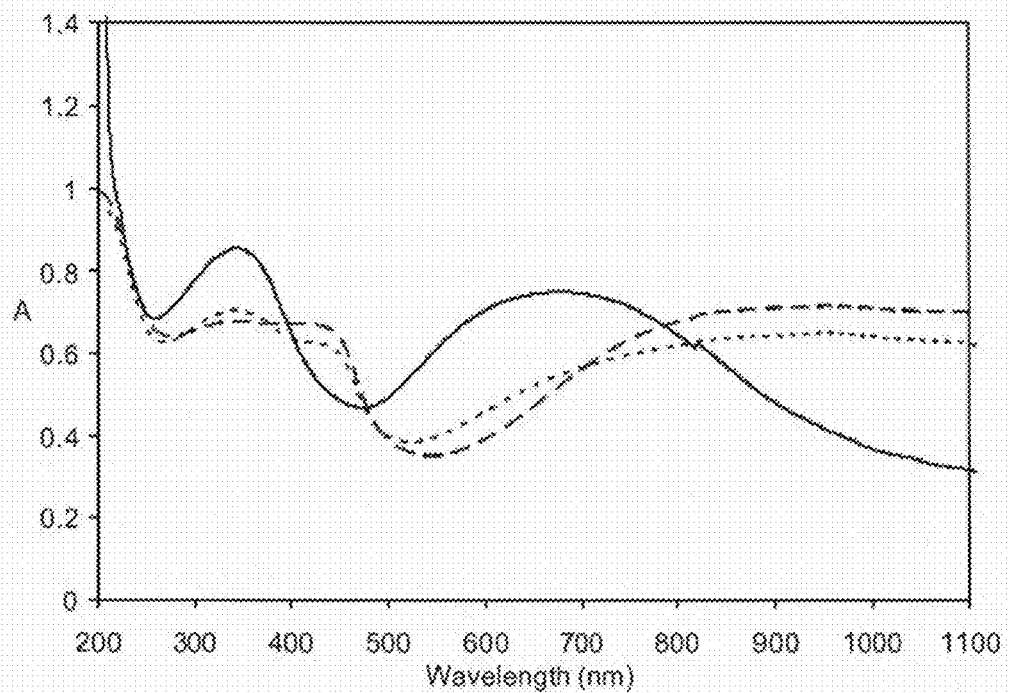
FIG. 6 is a UV/vis spectra of polyaniline/$HClO_4$ nanofibers dispersed in deionized water after purification by rinsing with deionized water (dotted line), after subsequent addition of a drop of dilute $HClO_{4(aq)}$ (dashed line) and after further adding a drop of 30% w/w $NH_4OH_{(aq)}$ (solid line).

Polyaniline/$HClO_4$ nanofibers are dispersed in deionized water via vigorously shaking by hand for UV/vis absorption studies. FIG. 6 shows UV/vis absorption spectra of polyaniline nanofibers obtained from $HClO_{4(aq)}$. After purification by dialysis against deionized water, polyaniline nanofibers present three absorption peaks c.a. 338 nm, 430 nm and 960 nm (free carrier tail) as shown in the dotted line of FIG. 6. By adding one drop of dilute 70% w/w $HClO_{4(aq)}$ to the above polyaniline nanofiber dispersion, the absorption intensity of the peaks at c.a. 338 nm decreases, simultaneous with the increase of the absorption intensity of the peak at c.a. 430 nm and 960 nm (free carrier tail) as shown in the dashed line of FIG. 6.

It is possible that the purification of polyaniline nanofibers by dialysis with deionized water results in removal of the dopant, $HClO_4$, within polyaniline backbone to form partially doped polyaniline nanofibers. Furthermore, adding a drop of 30% w/w $NH_4OH_{(aq)}$ to polyaniline/$HClO_4$ nanofibers dispersion introduces the formation of an absorption band c.a. 677 nm, simultaneously resulting in disappearance of two absorption bands c.a. 430 nm and 960 nm (free carrier tail) as shown in the solid line of FIG. 6. The two strong absorption bands c.a. 338 nm and 677 nm are attributed to the formation of emeraldine base.

Figure 7:
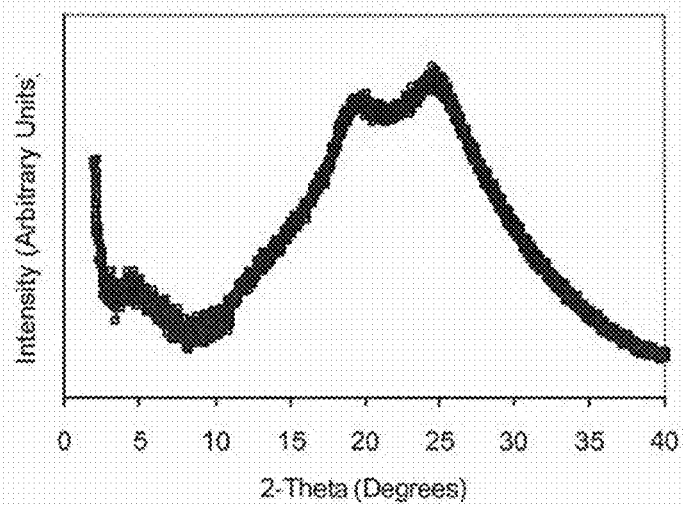
FIG. 7 is an X-ray diffraction pattern of the film formed by casting doped polyaniline/$HClO_4$ nanofibers from deionized water dispersion.

FIG. 7 shows X-ray diffraction (XRD) pattern of doped polyaniline nanofibers obtained from $HClO_{4(aq)}$. Two intense broad bands centered at $2\theta\sim20°$ and $\sim25°$ show that these nanofibers are partially crystalline. Comparing to previously reported data, there are no significant differences between the structural order of polyaniline nanofibers and that of nonfibrous polyaniline powders or films.

The suspension of polyaniline nanofibers obtained from $HClO_{4(aq)}$ was deposited and dried to form a dark green film on a glass slide prepatterned with four Au electrodes constructed by thermal evaporation. The bulk room temperature DC conductivities of polyaniline/$HClO_4$ nanofibrous film are in the range of 2-4 S/cm obtained from the standard 4-probe method. Based on UV/vis studies as shown in FIG. 6, we suggest that an individual nanofiber has a higher room temperature DC conductivity than nanofibrous films. This is supported by the free carrier tail associated with delocalization of electrons in the "polaron" band. As the inter-fiber interaction is negligible in these very dilute suspensions, the characteristics of the spectra are related to the properties of the individual nanofibers only. Furthermore, as shown earlier, there also is significant inter-fiber contact resistance between the individual nanofibers produced by using surfactants, thereby decreasing of the bulk conductivity.

In summary, polyaniline nanofibers are successfully synthesized for the first time using dilute polymerization resulting in the careful control of nucleation and growth. This is accomplished via reducing the concentrations of both monomer and oxidant with a constant molar ratio. We also demonstrate that different dopant acids produce similar morphology of polyaniline nanofibers. Additionally, the diameters of polyaniline nanofibers are tunable under the appropriate selection of dopant acids. The dispersion of polyaniline nanofibers can be cast to form highly porous nanofibrous films without deformation of the nanofiber morphology.

Porous Membrane Controlled Polymerization

A variety of inorganic/organic dopant acids were used to study the formation of polyaniline nanofibers in the porous membrane controlled polymerization, including hydrochloric acid (HCl), sulfuric acid ($H_2SO_4$), phosphoric acid ($H_3PO_4$), perchloric acid ($HClO_4$), 2-acrylamido-2-methyl-1-propanesulfonic acid (AMPSA), p-toluenesulfonic acid (p-TSA), (1S)-(+)-10-camphorsulfonic acid (CSA), methanesulfonic acid ($CH_3SO_3H$), etc. All precipitates show very similar nanostructured morphology. In addition, regardless of molar ratios of aniline to APS used, e.g. ranging from 4/1 to 1/2, and the concentration of dopant acids used, e.g. 0.2M to 6M, polyaniline precipitates obtained all present nanofibrous structures. However, the average diameters of nanofibers are strongly dependent on polymerization temperature. For example, nanofibers synthesized in $HClO_{4(aq)}$ at room temperature show larger diameters ranging from 70 nm to 180 nm (average diameter ~130 nm) confirmed via TEM compared to those obtained at lower temperature, 0~5° C. (ranging from 50 nm to 100 nm; average diameter ~80 nm). It is obvious that temperature controls the releasing rate of the reagents through the porous membrane.

Figure 8:
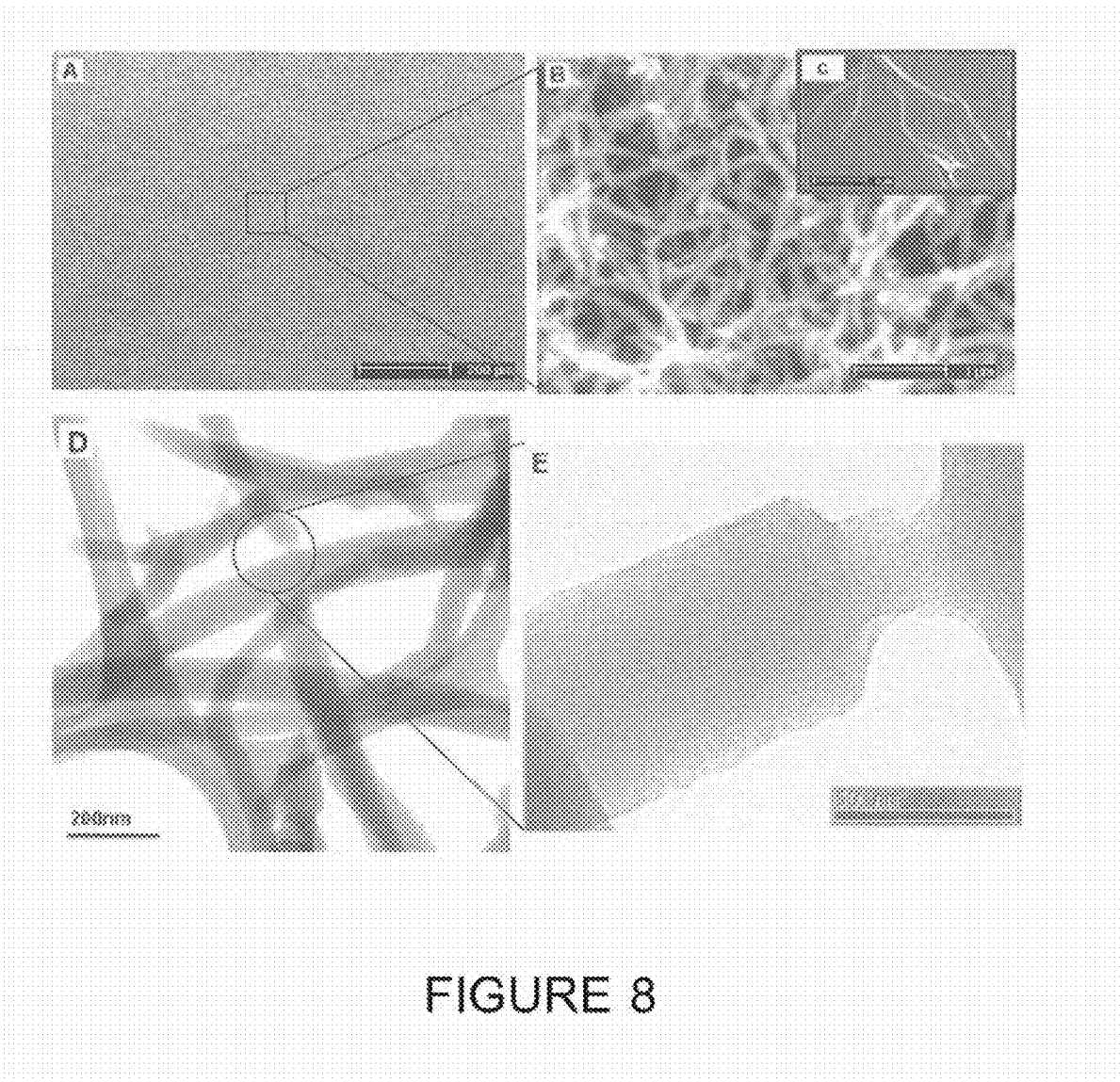
FIGS. 8(D and E) are transmission electron micrograph (TEM) of polyaniline nanofibers dispersed in ethanol under ultrasonic bath, and then deposited on copper grid substrate. (scale bar=(D) 200 nm (E) 50 nm).

As shown in FIG. 8 (SEM and TEM images), the dark green precipitate is comprised of nanofibrous structures with diameters ranging from 50 nm to 100 nm (average diameter ~80 nm), confirmed via TEM. The uniformity of polyaniline nanofibers obtained can be observed from the SEM image of FIG. 8A at low magnification (×100), with a scale bar=200 µm. It shows nearly ~100% of nanofibers formed in this chemical polymerization with the porous membrane control, which is demonstrated by a high magnification SEM image (×20,000) of FIG. 8B. FIG. 8 also show that polyaniline nanofibers are of the interconnected, branched and networked morphology. However, after dilution of the colloid suspension of polyaniline nanofibers with large amounts of water or ethanol, some single polyaniline nanofibers can be isolated from the agglomeration (FIG. 8C). It indicates that this kind of polyaniline nanofibers can be potentially used to fabricate nanoelectronic devices such as field-effect devices. Polyaniline nanofibers formed within the dialysis tubing also show very similar nanostructures as these found outside. There are also no significant differences on the nanostructured morphology as nanofibers are dedoped and redoped multiple times by base and acid solutions, respectively.

Figure 9:
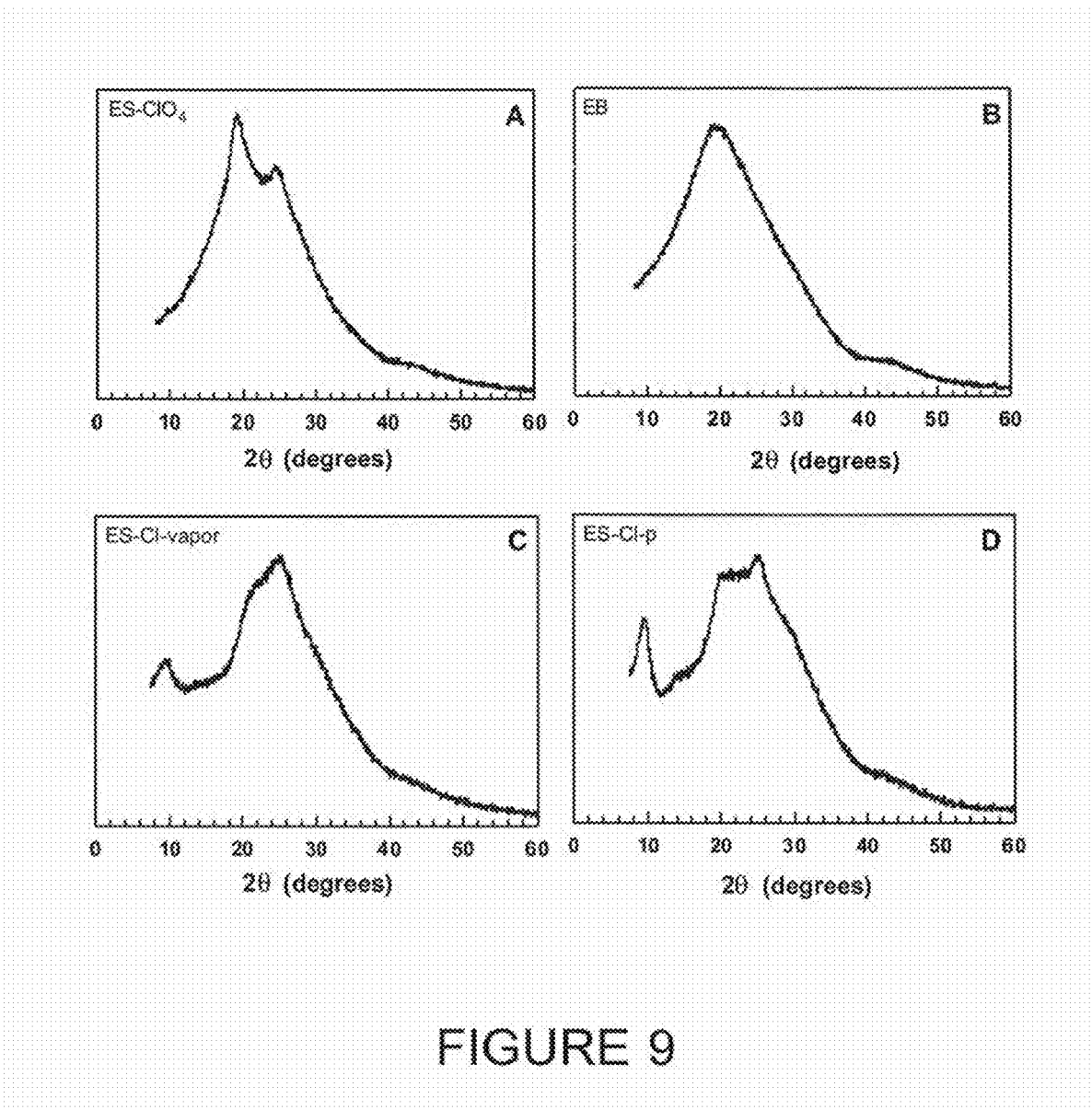
FIG. 9 are X-ray diffraction (XRD) patterns of polyaniline nanofibers. After purification, as-prepared polyaniline nanofibers are only partially doped by $HClO_{4(aq)}$. The sample is equilibrated with 0.1M $HClO_4$ $_{(aq)}$ (labeled as ES-$ClO_4$) (A). After purification (and without treatment by 0.1M $HClO_{4(aq)}$), the as-prepared sample is dedoped by 0.1M $NH_4OH_{(aq)}$, and then washed by deionized water to form emeraldine base (EB) (B). After XRD measurement of the sample (B), it is exposed to $HCl_{(v)}$ vapor for 30 minutes (labeled as ES-Cl-vapor) (C). A second portion of sample B (undoped polyaniline nanofibers, EB) is redoped by 0.5M $HCl_{(aq)}$ and then washed by dialysis against deionized water (labeled as ES-Cl-p) (D). All dispersed samples are deposited on Rigaku glass powder holder for measurement. X-ray patterns were taken with CuKα radiation (λ=1.54059292 Å).

FIG. 9 shows XRD patterns of polyaniline nanofibers obtained. After purification by deionized water, as-prepared polyaniline nanofibers which is in-situ doped by $HClO_4$ are dispersed in 0.1M $HClO_{4(aq)}$, termed ES-$ClO_4$. The XRD pattern of ES-$ClO_4$ reflects a partially crystalline structure (FIG. 7A). ES-$ClO_4$ belongs to class I (ES-I) and is typical for partially protonation with $HClO_{4(aq)}$. One intense broad band centered at $2\theta\sim20°$, a shoulder at $2\theta\sim30°$, and a weak band at $2\theta\sim45°$ show that emeraldine base form (EB) of polyaniline nanofibers obtained is a strongly disordered polymer (FIG. 9B) which agrees with the electron diffraction pattern obtained (not shown). This diffraction pattern is in agreement with that of non-fibrous emeraldine base samples, EB-I. When nanofibrous EB is redoped by $HCl_{(v)}$ vapor (labeled as ES-Cl-vapor) or aqueous 0.5M $HCl_{(aq)}$ (labeled as ES-Cl-p), new crystalline structures are introduced (FIGS. 9, C and D).

Comparing to our earlier publications, the XRD patterns of ES-Cl-vapor and ES-Cl-p are ascribed to class I material (ES-I) by the preparation procedures, and generally possess ES-I crystal structures. Similarly, the X-ray diffraction patterns of ES-Cl-vapor (FIG. 9C) and ES-Cl-p (FIG. 9D) are similar to that of ES-I as expected.

UV/vis absorption spectra (FIG. 10) demonstrate that polyaniline nanofibers obtained have different absorption patterns corresponding to different protonation levels and are in excellent agreement with the UV/vis absorption spectra of nonfibrous polyaniline powders of the similar doping level. This supports the presence of the same chemical structure for nanofibrous polyaniline and granular (nonfibrous) polyaniline. Furthermore, we note that based on UV/vis absorption (FIGS. 10, B and D), ES-Cl-p shows partial protonation with HCl.

Figure 10:
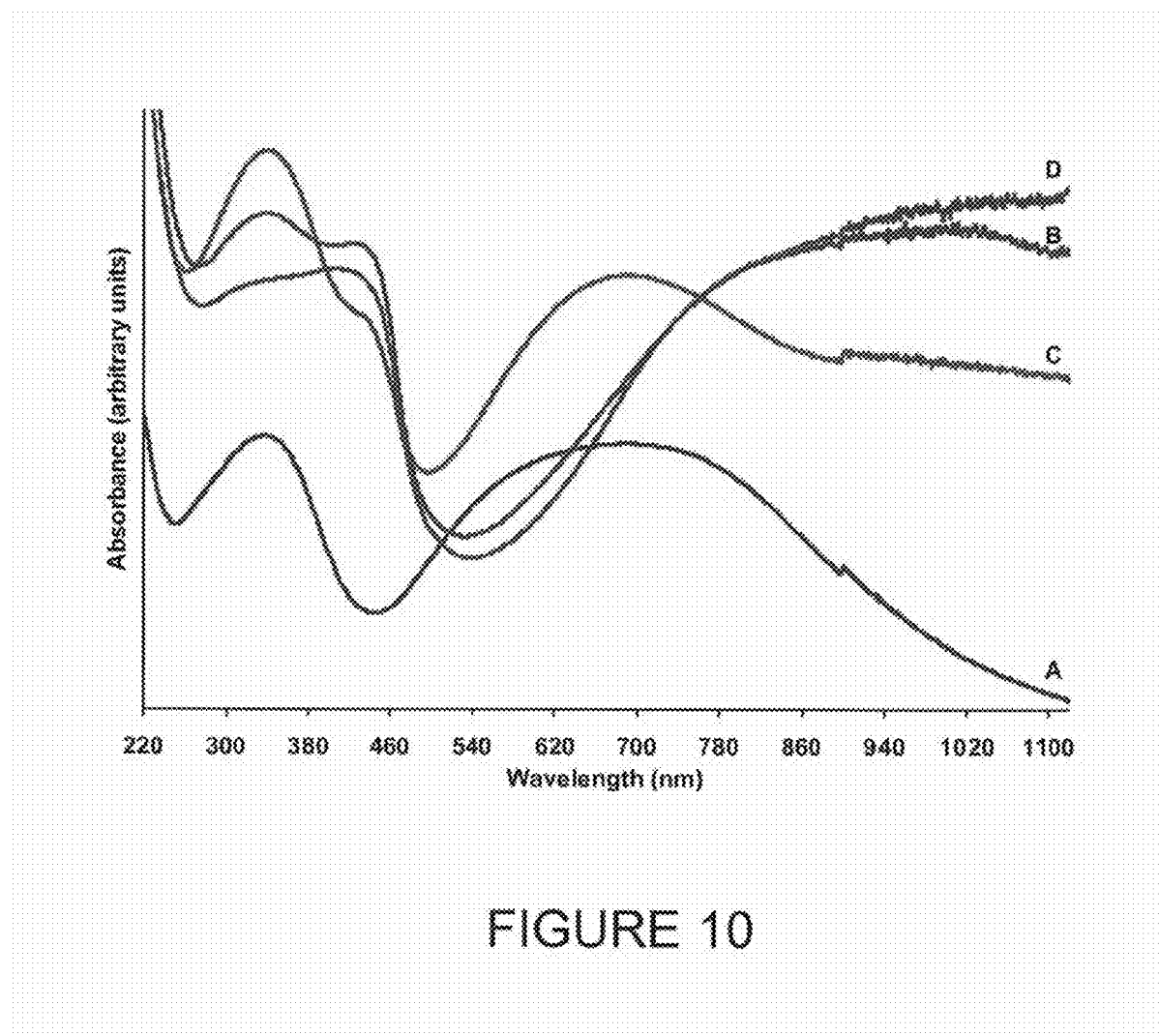
FIG. 10 are UV/vis spectra of polyaniline nanofibers. (A) Emeraldine base form (EB) of polyaniline nanofibers. Note that the unusually broad nature of the peak at 500-900 nm suggests greater planarity of the polymer chains and/or the possible presence of residual dopants in these nanofibers. (B) Undoped polyaniline nanofibers (EB) was redoped by 0.5M $HCl_{(aq)}$, and then washed by deionized water to form the dispersion of the partially doped emeraldine salt, termed ES-Cl-p. (C) ES-Cl-p precipitate was redispersed in a large amount of deionized water for UV/vis study, resulting in the partial removal of counter ion within the polymer backbone to form ES-Cl-w. (D) Addition of a droplet of aqueous 37% w/w $HCl_{(aq)}$ to the above dispersion, ES-Cl-w results in fully doped polyaniline nanofibers, ES-Cl.

The dispersion of polyaniline nanofibers was deposited onto a glass slide to form a dark porous green film. Subsequently, four Au electrodes were deposited by thermal evaporation to form the contacts. The bulk conductivity for the redoped nanofiber (ES-Cl-p) array is obtained in the range of 0.9-1.3 S/cm based on the standard 4-probe DC measurement at room temperature. As the sample ES-Cl-p is exposed to $HCl_{(v)}$ vapor, the conductivity is changed to 2.3-2.5 S/cm. This reconfirms that ES-Cl-p is partially doped by HCl as mentioned above. The bulk room temperature DC conductivity of the nanofiber film is comparable to that of the nonfibrous powder. However, we suggest that an individual nanofiber has a higher conductivity than those films because the free carrier tails associated with delocalization of electrons in the "polaron" band are shown in UV/vis absorption spectra of doped polyaniline nanofibers (FIG. 10). As very dilute dispersion of nanofibers is used in the optical study, the characteristic of UV/vis absorption is only related to the properties of individual nanofibers. Thus, the lower bulk R.T. DC conductivity of the nanofiber film is attributed to the existence of the inter-fiber contact resistant.

For increased control of the nanofiber preparation, we used two segments of dialysis tubing to separate aniline and oxidant, respectively. The product shows extremely similar nanofibrous morphology to those obtained from one dialysis tubing used. When the solvent inside dialysis tubing is replaced with organic solvents, e.g. toluene, no obvious difference is observed for the nanofibrous morphology. The nanofibers is also formed exclusively even when reaction is carried out with disturbance (e.g. stirring), but the most products are preferred to precipitate inside the tubing. Hence, the approach described here provides a significant possibility to synthesize conductive/semiconductive polymer and copolymer nanofibers. We note that it may also be widely applicable to the fabrication of the nanofibers of non-conductive polymers.

In summary, high-quality polyaniline nanofibers are successfully synthesized for the first time using porous membrane to control the polymerization of polyaniline resulting in the careful control of nucleation and growth. The diameters of polyaniline nanofibers are tunable under the appropriate selection of dopant acids and/or temperature. The dispersion of polyaniline nanofibers can be cast to form highly porous nanofibrous films without deformation of the nanofiber morphology. UV/vis absorption and X-ray diffraction structure show that polyaniline nanofibers have similar absorption and diffraction patterns to those previously reported for nonfibrous polyaniline.

Morphology, Alignment and Orientation of Fibers

Figure 11:
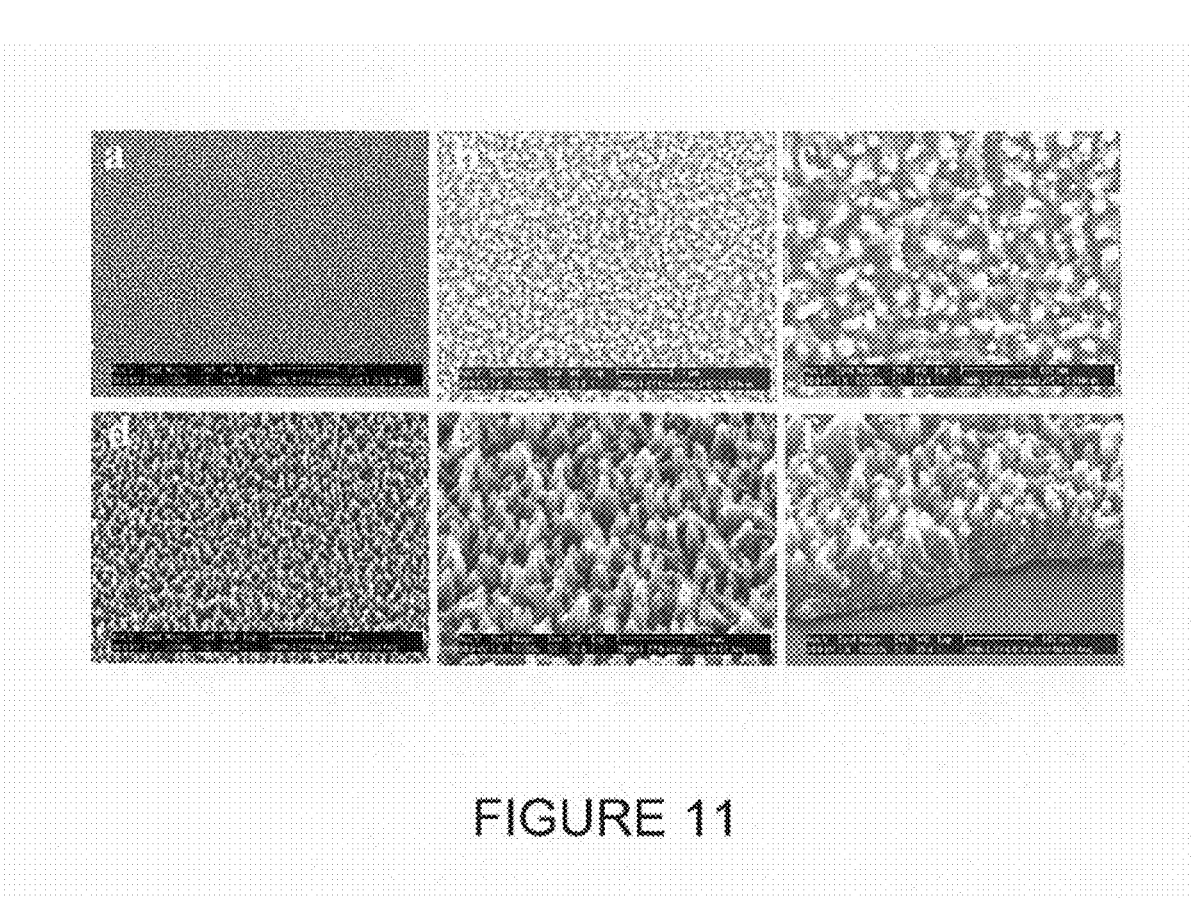
FIG. 11 are Scanning electron micrographs (SEM) of aligned polyaniline nanofibers grown on the over-head PET transparency with surface-coating removed. (a) Top view, low magnification. (b)-(c) Top view, high magnification. (d)-(e) Tilted view, high magnification. (f) Tilted view for the edge of the partial removed thin film. Polymerization conditions: [Aniline]=0.01M, [Aniline]/[APS]=1.5, Temperature=0~5° C. (ice bath), stirring reaction, and [$HClO_4$]=1M.

The highly uniform, green and transparent thin film deposited by dilute polymerization or porous membrane controlled polymerization is very strongly adhered onto most any substrate. The morphology of the thin film is examined by SEM. As shown in FIG. 11, the thin film deposited by dilute polymerization shows morphology with aligned and well-oriented polyaniline nanofibers. The thin film shows the highly uniform white bright spots when the film is examined from top view (FIG. 11(a)-(b)). Those whit spots actually are the tips of nanofibers (FIG. 11(c)). When the sample is tilted a certain angle (e.g. an angle 50°), those nanofibers appear (FIG. 11(d)-(f)). A close view to the edge of partly removed thin film shows that those nanofibers are perpendicular to the substrates (FIG. 11(f)). The diameters of the tips of the single nanofibers are ranging from 20 nm to 40 nm. Some nanofibers pack together to form a bundle resulting in a larger white spot with diameters ranging from 40 nm to 70 nm. The average length of the uniform aligned nanofibers is ~360 nm, confirmed by Surface Profiler (Tencor Instruments, Alpha-Step 500).

The morphology of the aligned and oriented nanofibers is sensitive to the temperature and concentration of the reagents used for polymerization. For example, low temperature advantages the formation of aligned and oriented nanofibers. The morphology of the deposited thin film is extremely similar to those nanofibers obtained in the bulk solution when the reaction is carried out at the room temperature (e.g. 21~24° C.).

Figure 12:
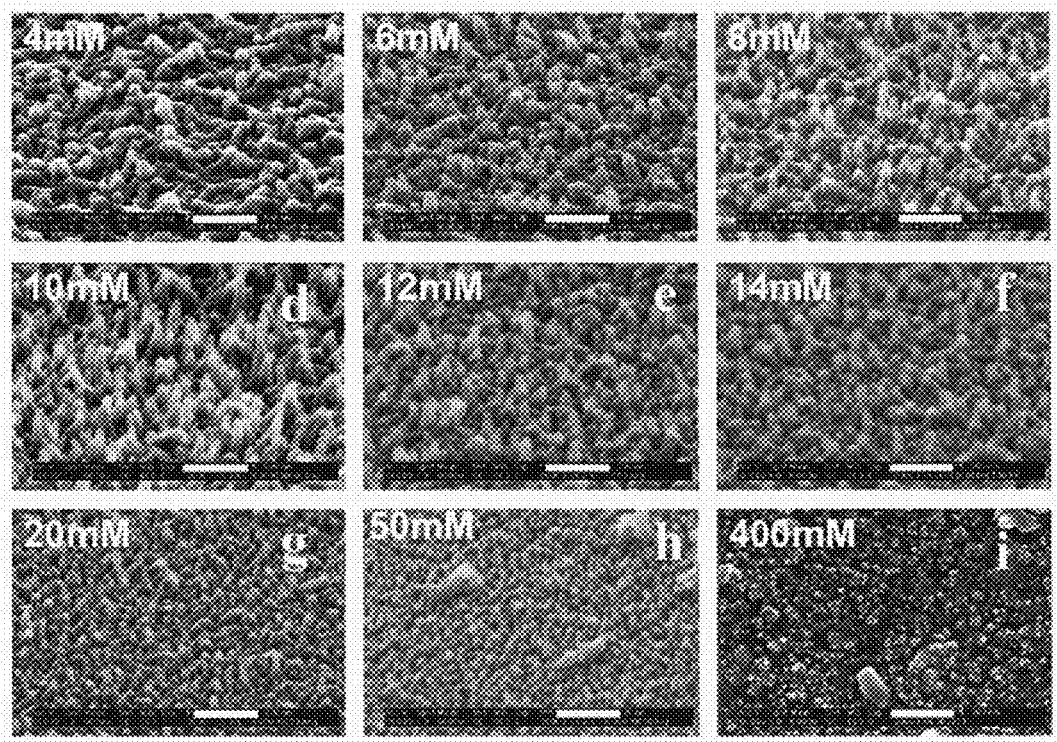
FIG. 12 is a tilt-viewed scanning electron micrograph (SEM) of aligned polyaniline nanofibers grown on an over-head PET transparency with surface coating un-removed. The left-upper notation is the initial concentration of aniline used for polymerization, where mM=$10^{-3}$ M. The molar ratio of aniline to APS is fixed at 1.5. All polymerization is carried out and in the ice bath (0~5° C.) and [$HClO_4$]=1M. (The scale bar=500 nm)

When the initial concentration of aniline is used in the range of 8 mM to 12 mM and reaction is performed at low temperature (e.g. 0~5° C.), the final morphology of the thin film is aligned and oriented nanofibers of perpendicularity to the substrates (FIG. 12). There is no apparent difference on the morphology of aligned and oriented polyaniline nanofibers when the sizes of the reaction chambers or containers (reaction volume) are reduced or enlarged as long as the initial concentration of the reagents is fixed in the range of 8 mM to 12 mM. All morphology of aligned and oriented polyaniline nanofibers for the same polymerization conditions is reproducible. This indicates that the methods we propose here allow us to scale up the coating on any types of the substrates.

We have successfully deposited the aligned and oriented nanofibers onto any size and any geometry substrate, including submicron PET fibers, any size of the micron channels and micron pillars, 8.5 inches×11 inches letter sized transparency, any size of ITO coated glass, etc. The same morphology is also observed on molecularly modified surfaces of the substrates (e.g. 3-aminopropyltriethoxysilane (APTES)-modified glass). The free-standing thin film collected at the interface of air and polymerization solution also shows the same morphology as those found on the substrates. Disturbance (e.g. stirring) of the reaction and dopant acids are only slightly effect on the final morphology. However, more uniform coating is produced when the monomer and oxidant are distributed homogenously during the polymerization.

Figure 13:
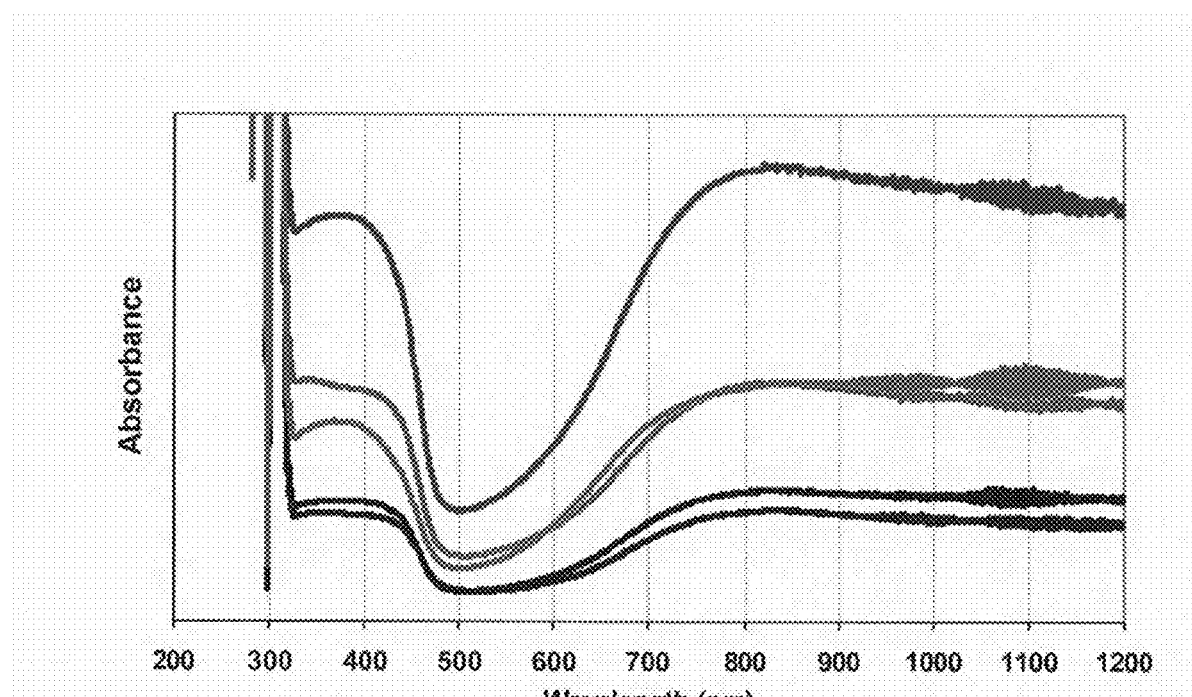
FIG. 13 is a UV/vis spectra of aligned and oriented polyaniline nanofibers grown on the over-head PET transparency with surface-coating removed. The notations on the spectra are the initial concentration of aniline used for polymerization, where mM=$10^{-3}$ M. Polymerization conditions: [Aniline]=shown on the spectra, [Aniline]/[APS]=1.5, Temperature=0~5° C. (ice bath), stirring reaction, and [$HClO_4$]=1M.
Figure 14:
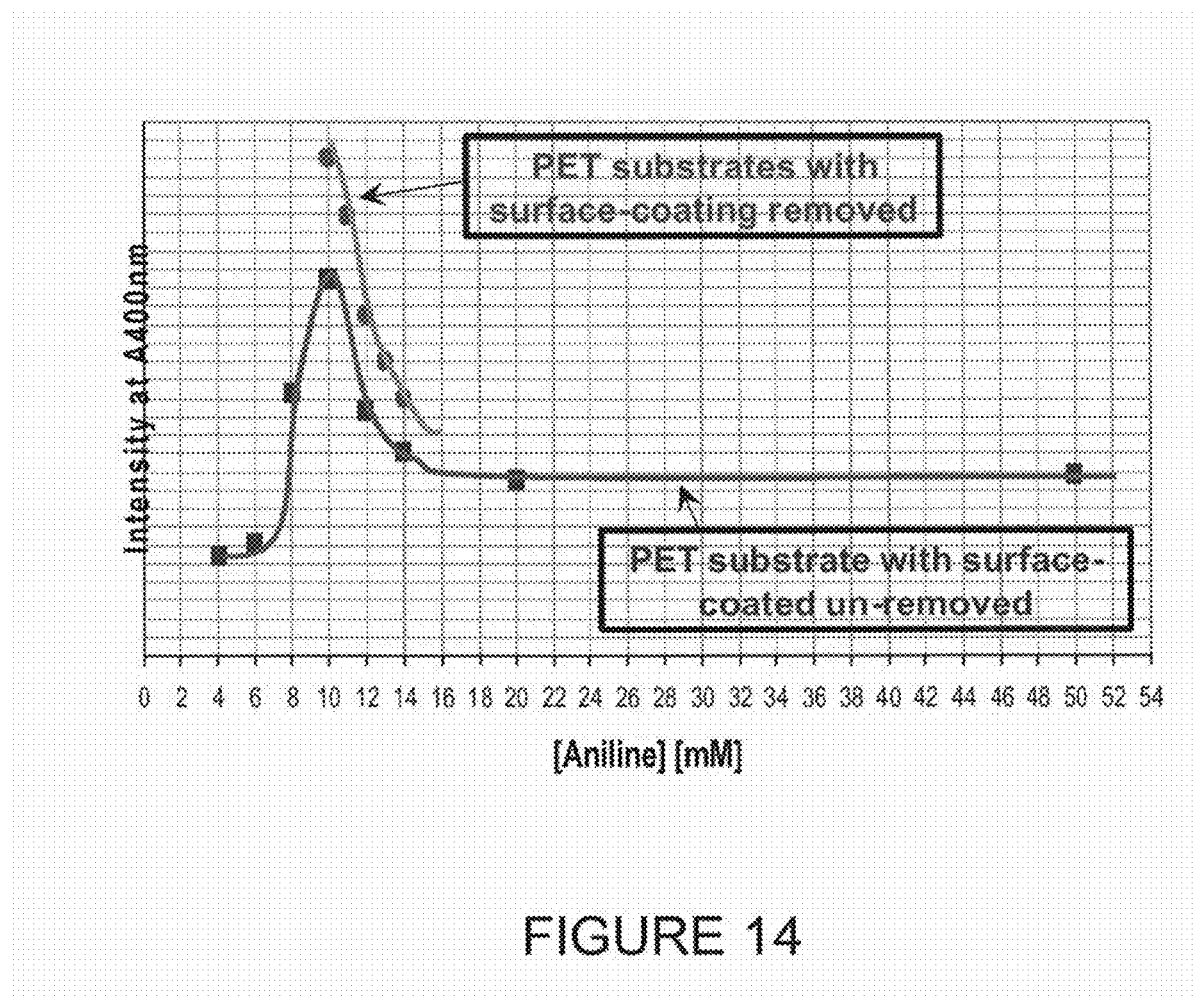
FIG. 14 is a graph of UV/vis absorption intensities as a function of concentration of aniline.

In one trial, aligned and oriented polyaniline nanofibers are deposited onto over-head PET transparency for UV/vis absorption studies. The surface coating of the over-head PET transparency is gently wiped away in one direction using tissue paper with acetone. FIG. 13 shows UV/vis absorption spectra of the thin film polyaniline obtained from $HClO_{4(aq)}$. Two absorption bands c.a. 430 nm and 860 nm (free carrier tail) are observed for the different initial concentration of aniline used for polymerization. The UV/vis absorption patterns of the thin film of aligned and oriented polyaniline nanofibers obtained are consistent with previously reported results. It is obvious that the absorption intensities at 400 nm vary from the initial concentration of aniline used for polymerization. As shown in FIG. 14, the maximum UV/vis absorption intensity occurs for the 10 mM (0.01 M) of the initial concentration of aniline. The thickness of the thin film is also found to be varied by the initial concentration of aniline. For example, the measured thickness of the thin film is ~360 nm for 10 mM of aniline and ~300 nm for 12 mM of aniline. Thus, the maximum UV/vis absorption intensity at 400 nm may be correlated to thickest thin film formed with the morphology of uniform aligned and oriented polyaniline nanofibers only if the initial concentration of aniline is fixed at 0.01M.

The coating surfaces of aligned polyaniline nanofibers are superhydrophilic, but can be changed to become superhydrophobic after exposure to $CF_4$ plasma. Being able to modify the molecular structure of polyaniline nanofibers without damaging the nanostructures broadens the applicability of polyaniline nanofibers, as described more fully below.

APPLICATIONS

Surface Response
Superhydrophilic/Superhydrophobic and Superoleophilic/Oleophobic Surfaces Surface modification has attracted much attention in the field of nanotechnology in the recent years. Wettability of solid surfaces is governed by both surface energy and roughness or surface structures. The surface energy is the intrinsic property of each solid material dependent on the chemical composition. In general, a hydrophobic surface, in which the water contact angle is enhanced by small roughness and is higher than about 150°, is called "superhydrophobic", and a hydrophilic surface, in which the water contact angle is similarly reduced by small roughness and is less than 5°, is called "superhydrophilic." Similarly, an oleophobic surface, in which the contact angle of an oil on the surface is enhanced by small roughness and is higher than about 150°, is called "superoleophobic", and a oleophilic surface, in which the oil contact angle is similarly reduced by small roughness and is less than 5°, is called "superoleophilic." An oleophobic surface, with a contact angle of between 90 and 150° is simply considered "oleophobic".

Figure 15:
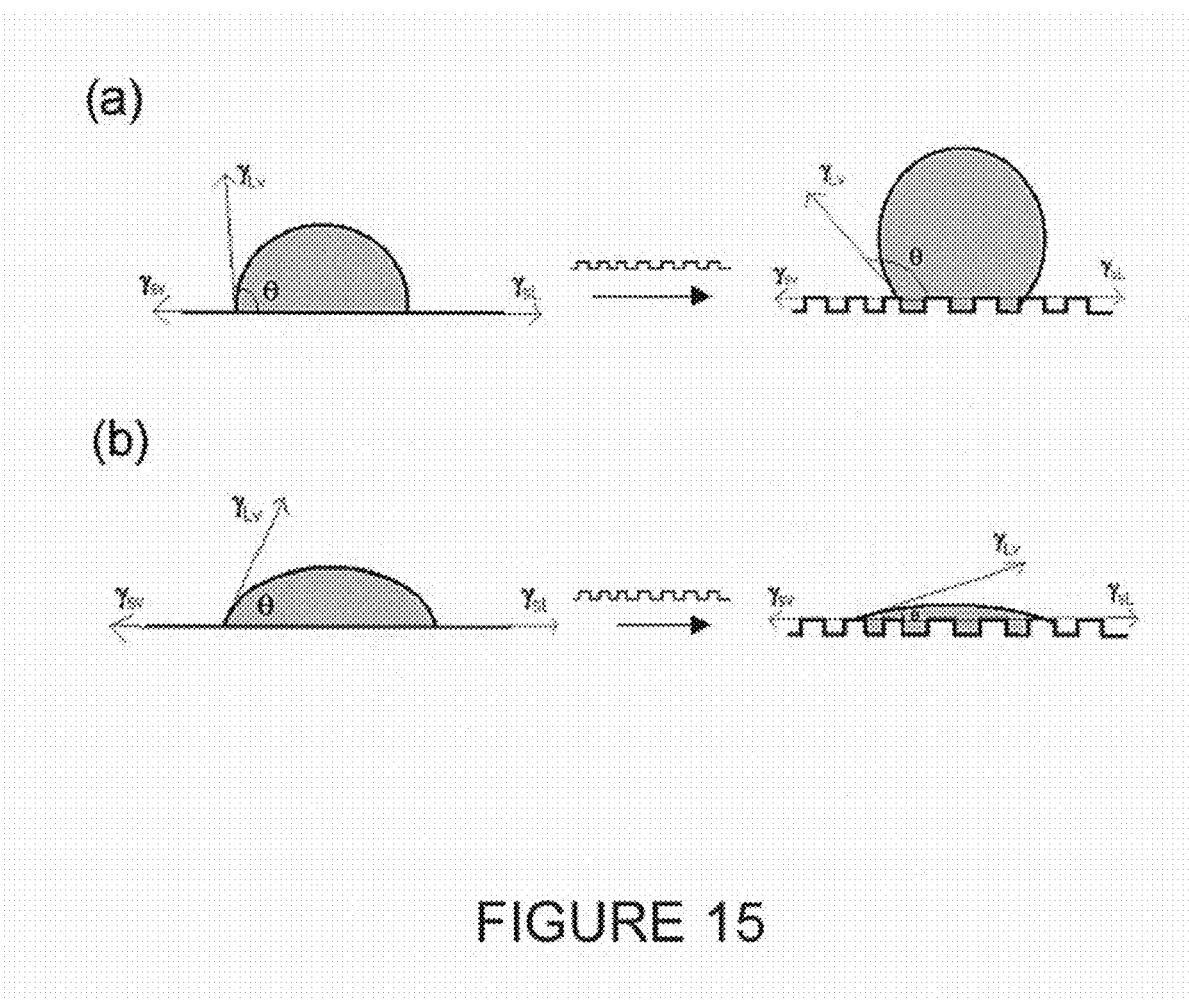
FIG. 15 shows the surface roughness effect of the (a) hydrophobic and (b) hydrophilic surfaces.

Those phenomena can be explained by Wensel equation Eq. (1):

$$\cos\theta = r(\gamma_{SL} - \gamma_{SL})/\gamma_{LV} \quad \text{(Eq. (1))}$$

where $\gamma_{SV}$, $\gamma_{SL}$ and $\gamma_{LV}$ are the interfacial energies per unit area of the solid-gas, solid-liquid and liquid-gas, respectively, and r is a roughness factor, which is defined as the ratio of the actual area of the rough surface to the geometric projected area and is always larger than 1. Therefore, from equation (1), we know that the roughness of the substrates can enhance both the hydrophobicity of the hydrophobic surfaces and the hydrophilicity of the hydrophilic ones, as shown in FIG. 15. In addition, subsequent researchers assumed that the air is superhydrophobic with a water contact angle of 180°. They claimed that air trapped on the surfaces may enhance the hydrophobicity. Thus, they proposed equation (2) to describe the contact angle at a solid surface in the presence of air.

$$\cos\theta = f\cos\theta + (1-f)\cos 180° = f\cos\theta + f-1 \quad \text{(Eq. (2))}$$

where f is described as the fraction of a wetted solid surface area to actual area of the solid surface and air is assumed to be superhydrophobic with a water contact angle of 180°.
Aligned and Oriented Polyaniline Nanofibers The surfaces coated by aligned polyaniline nanofibers show the property of superhydrophilicity with water contact angle less than 5 degrees. However, after exposure to a fluorocarbon plasma (such as $CF_4$ or $CHF_3$ plasma), these same surfaces exhibit a dramatic change to superhydrophobicity and water contact angles higher than 175°. The plasma thus lowers the surface energy. Such novel coatings provide a wider route to synthesize nanostructures of conductive, semiconductive, and non-conductive polymers for use in controlling the delivery of DNA via nanoneedle patches.
Dual Surface Response
Directly Patterned Surfaces with Superhydrophilicity/Superydrophobicity Superoleophilicity/Oleophobicity One can use a nucleophile (e.g. sodium metabisulfite, sodium bisulfite, sodium sulfite, or sulfite salts) to modify the surfaces of polyaniline nanofibers in base form. After molecular modification, the surface still maintains the superhydrophilicity because the functional group of sulfite ($-SO_3^-$) covalently bonded to the backbone of polyaniline nanofibers has higher surface energy (i.e. hydrophilic). Thus, when the entire surfaces are exposed to low surface energy materials in acid form (e.g. DBSA, fluorinated alkyl sulfonic acid, etc.), the modified area is not redoped by such acids. This leaves the modified area superhydrophilic and causes the unmodified area to become hydrophobic. Thus, we can create patterns on the surfaces of polyaniline with different properties. This technique may be applied in order to write patterns on the surface of aligned and oriented fibers through, e.g. an ink-jet printer.
Multilayer Nanostructures Polyaniline has three different oxidation/reduction forms. Generally, standard chemical synthesis produces emeraldine salt. After the dedoping process by basic solution, emeraldine salt (ES) turns to emeraldine base (EB). When EB form is exposed to oxidizers, it turns to pernigraniline base (PB). The color of the aligned nanofibers coated film changes from blue to pink. The oxidation potential of pernigraniline oxidation state is ~0.8 V vs. SCE, which is sufficient to polymerize (initiate) some monomers (e.g. pyrrole (0.5 V vs SCE). Thus, there is contemplated the process wherein a conducting or non-conducting polymer is polymerized on the oriented nanofibers. This process can be used to create different surface properties. In one exemplary process, pyrrole in 1M HCl is deposited on the aligned nanofibers. The pyrrole is then polymerized, forming aligned fibers as well. After deposition and polymerization of the pyrrole, the average size of the tips changes to 120 nm. Other exemplary polymers that can be used include poly(3,4-ethylenedioxythiophene), polystyrene and poly(2,3,4,5,6-pentafluorostyrene). The polymer can polymerize to form a conformal coating on the aligned nanofibers. This process opens a possible route to synthesize the oriented nanostructures of other conductive polymers. These multilayer-type oriented nanostructures will have broad applicability in many areas.

Non-conductive polymer, e.g., polystyrene or poly(2,3,4,5,6-pentafluorostyrene), can be grafted onto the surfaces of aligned polyaniline nanofibers. The grafted polymerization may be performed by exposing styrene or 2,3,4,5,6-pentafluorostyrene, which are cast on top of aligned polyaniline, to UV irradiation at ~50-70° C. for a period of time under nitrogen. Styrene or 2,3,4,5,6-pentafluorostyrene also can be initiated and then polymerized onto aligned polyaniline nanofiber surface at ~50-70° C. for a period of time under nitrogen using the free-radical initiator (e.g., azobisisobutyronitrile (AIBN), benzoyl peroxide, or 1,1-azobis(cyclohexanecarbonitrile)). Non-grafted homopolymers of polystyrene and poly(2,3,4,5,6-pentafluorostyrene) can be removed by chloroform, toluene, xylene or tetrahydrofuran. The amount of styrene or 2,3,4,5,6-pentafluorostyrene used can be varied from 100% to 1% w/w (diluted by chloroform, toluene, xylene or tetrahydrofuran).

Pattern by Printer Toner (Line-Patterning)

An easy patterning method, i.e. line patterning, is used to demonstrate that our two methods as mentioned above to deposit aligned polyaniline nanofibers can also be grown on pre-patterned substrates. The pattern can be constructed using any removable material on a substrate. Although not intended to be limiting, the removable material can be, e.g., an ink or toner printed using any conventional type of printer on a substrate to which it loosely adheres (such as an over-head PET transparency film). The aligned fibers are then deposited on the substrate, such that both the pattern and at least a part of the remainder of the substrate is coated. The removable material is then removed by known methods (such as sonication in the case of ink of an over-head film). This removes the aligned nanofibers covering the pattern as well, while keeping the aligned nanofibers on the rest of the substrate intact, creating, in effect, a negative pattern of aligned nanofibers.

Figure 16:
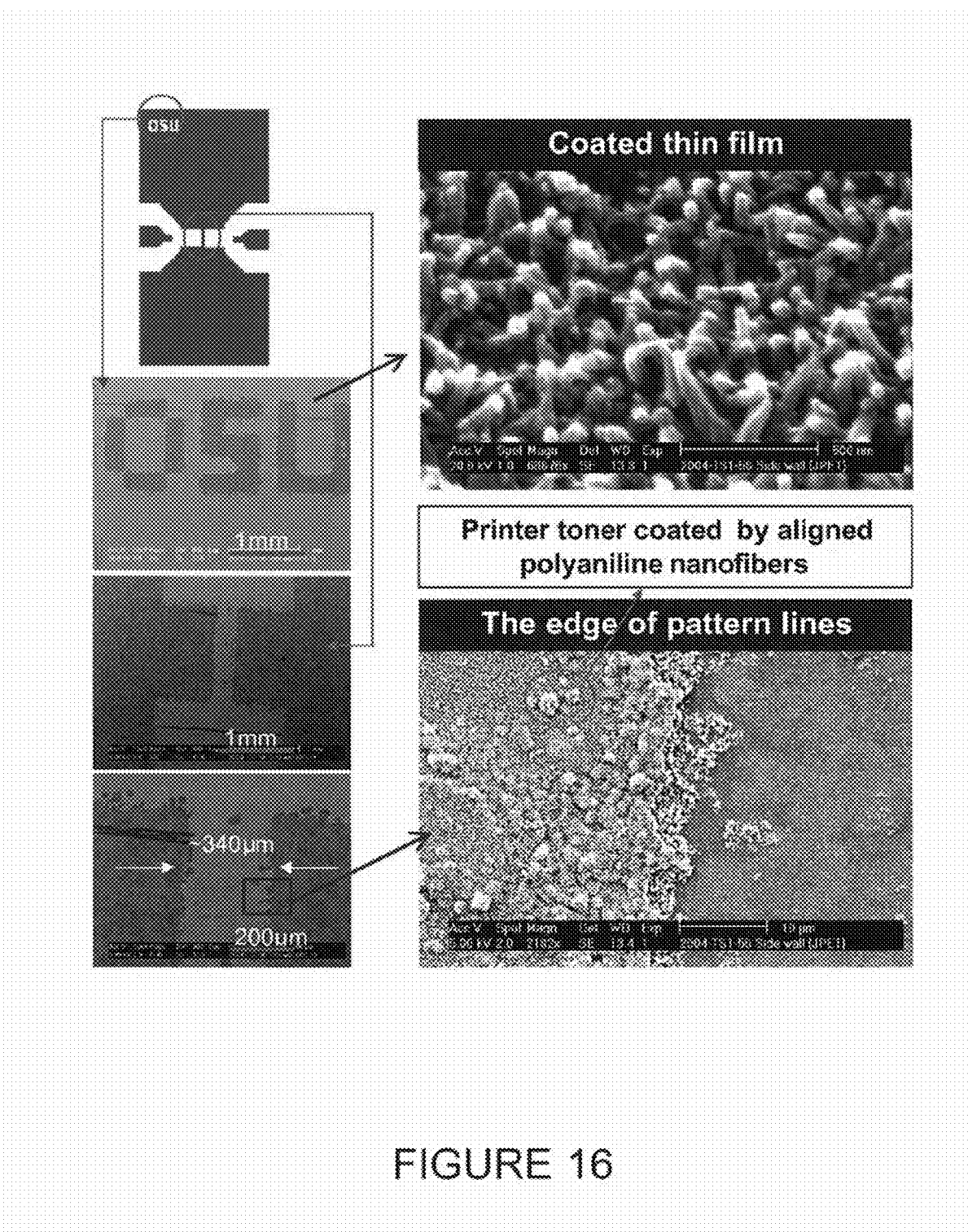
FIG. 16 shows aligned polyaniline nanofibers deposited on the line-patterning over-head transparency film. The uncoated area results from the removal of the printer toner.

Thus, in one example, a line pattern was constructed by Microsoft PowerPoint 2000 SR-1 and printed by Hewlett-Packard LaserJet 4M on an over-head transparency film. As shown in FIG. 16, the coated area shows the morphology of aligned polyaniline nanofibers. After the removal of printer toner, there is no apparent difference in the morphology of aligned nanofibers. This indicates that we may use this method to confine the growth of aligned polyaniline nanofibers on the certain area for the applications on chemical sensors, biosensors, etc.

DNA Stretching on the Surfaces of Aligned and Oriented Nanofibers

We use the coated surfaces of aligned polyaniline nanofibers prepared by above two methods to stretch DNA. After the surfaces are coated by aligned polyaniline nanofibers, they show superhydrophilicity. This indicates that a water droplet will spread out on the surfaces with a contact angle less than 5°. When the aqueous solution of λ-DNA is injected to the coated surfaces, DNA is stretched by the strong capillary force resulting from the superhydrophilic coated surfaces. The same effect is seen if polypyrrole is deposited on a surface of the aligned polyaniline.

Figure 17:
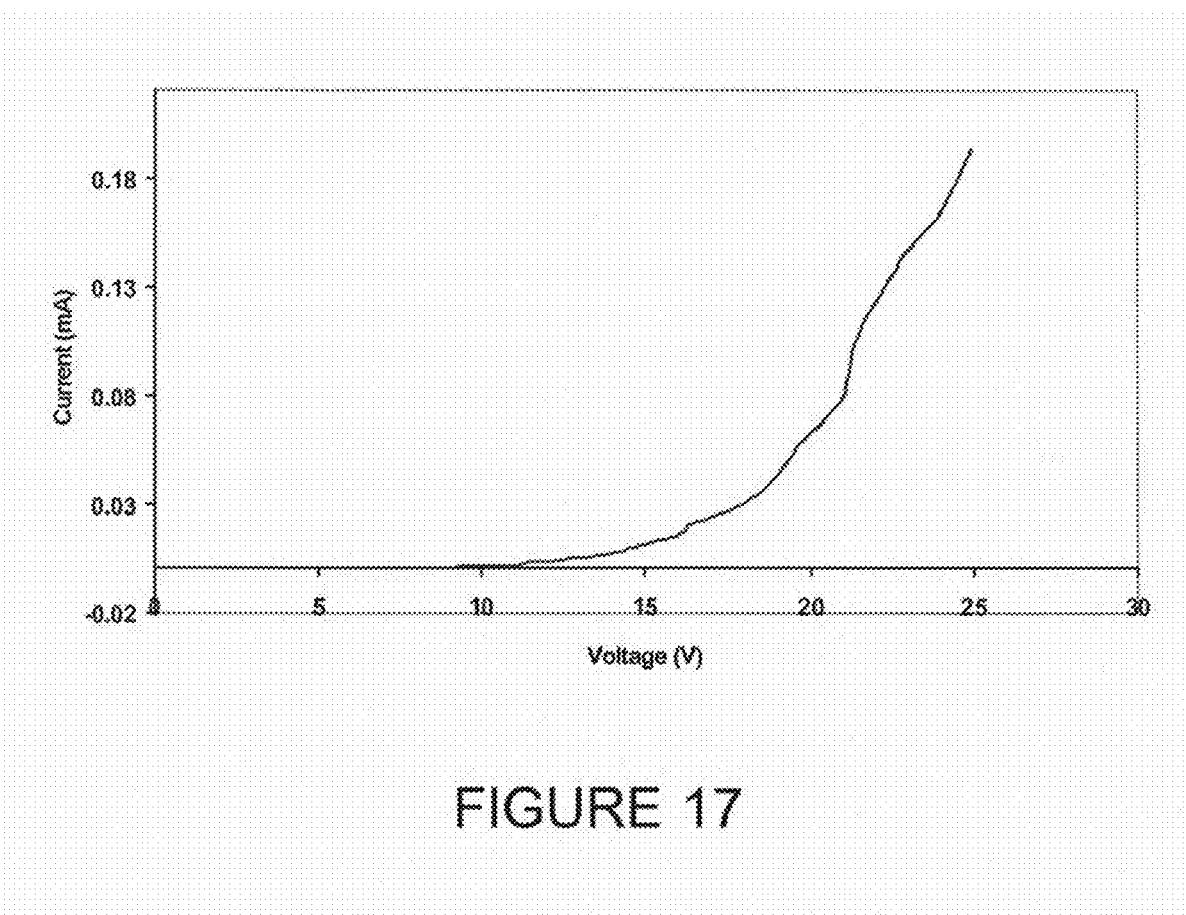
FIG. 17 is a graph of the operation voltage of an ITO electrode coated with a layer of aligned polyaniline as a function of current in a ITO/PAN nanofiber/$Alq_3$/Ca/Al Organic Light Emitting Device structure.
Figure 18:
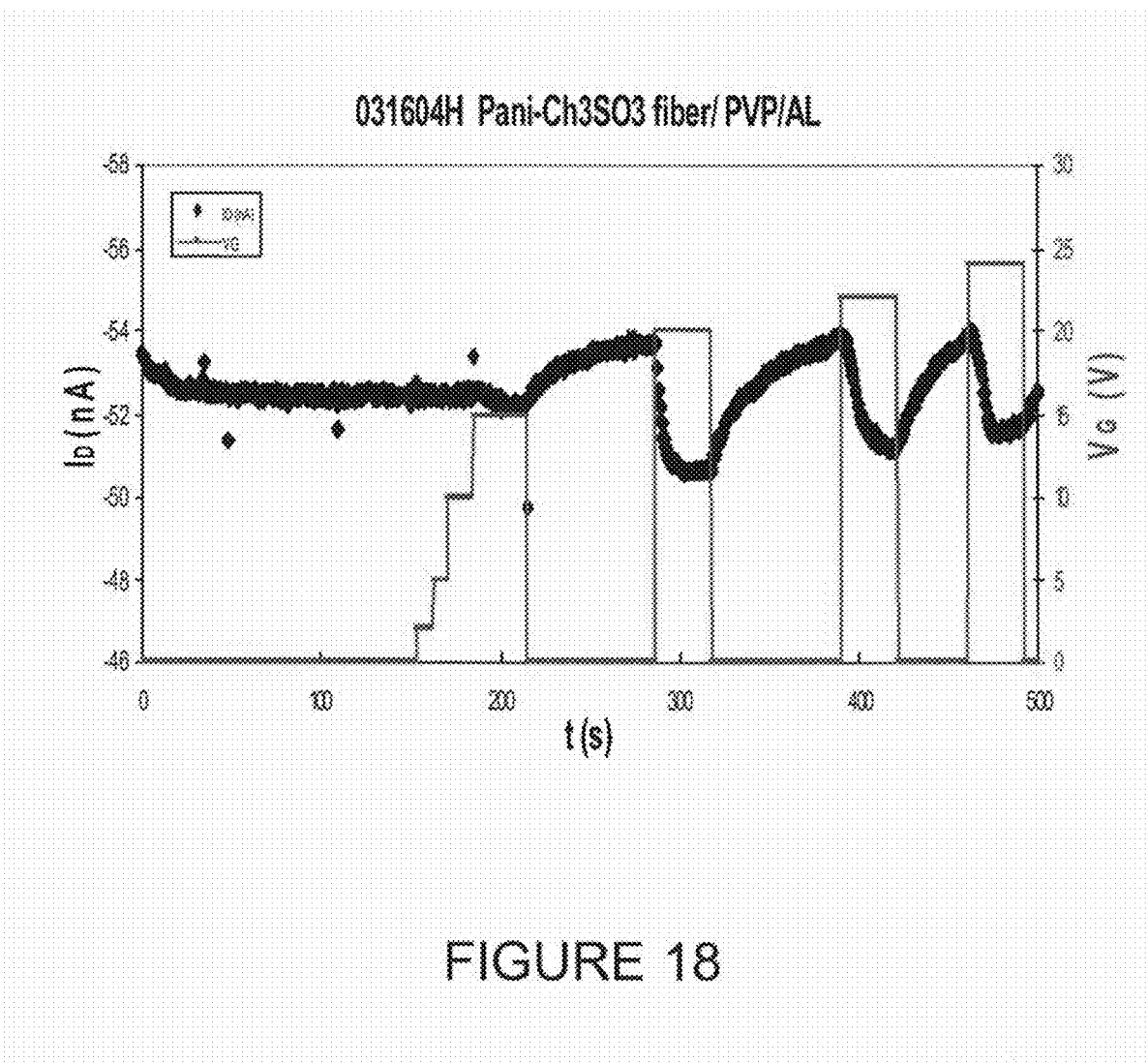
FIG. 18 is a graph showing the conductance change of nanofibers upon applying gate voltages in a field effect device based on polyaniline nanofibers.

Low Work Function Electrodes Fabricated by Aligned and Oriented Nanofibers for Organic Light-Emitting Diodes We also demonstrate that the surface coating of aligned polyaniline nanofibers can be used as the electrodes for organic light-emitting diodes. The term "organic" is meant to encompass both small molecule based devices, as well as those using oligomers and polymers. The results show that the devices with the coating of aligned polyaniline nanofibers on the ITO surfaces have very low operation voltages compared the bare ITO electrodes. That is, the polyaniline lowers the operating voltages of the electrodes. The effects are seen for any type of electrodes, including both transparent and non-transparent electrodes, as well as Au, ITO and other electrodes. FIG. 17 shows operating voltage for a ITO/PAN nanofiber/Alq3/Ca/Al electrode as a function of current. It is noted that the use of such aligned nanofibers will provide lower voltage operation for light emitting polymer based LEDs e.g., polyfluorene, small molecule based LEDs, e.g., $Alq_3$, and oligomer based LEDs, e.g., alpha sexithiophene based LEDs.

We also demonstrate that the surface coating of aligned polyaniline nanofibers can be used as the sensors for chemicals. Sensors fabricated by the aligned polyaniline nanofibers have very fast response when the devices are exposed to HCl vapor or $NH_4OH$ vapor.

Sensors based on aligned polyaniline nanofiber network can be prepared by the methods described herein. In one embodiment, a polyaniline nanofiber network was assured to be fully doped and highly conducting by exposure to 37% w/w aqueous HCl. The fiber network placed on a substrate was then exposed to vapor from a drop of 30% w/w aqueous $NH_4OH$ placed several cm from the nanofiber network. The resistance of the nanofiber network increases over many orders of magnitude in a few seconds. Substantial increase in the nanofiber network resistance occurs in less than one second. In addition, field effect device based on polyaniline nanofibers in contact with source and drain electrodes have been demonstrated, as described in the parent application.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

What is claimed is:

1. A process of stretching DNA comprising the steps of:
    coating a surface of a substrate with aligned polyaniline or aligned substituted polyaniline nanofibers to form a superhydrophilic surface;
    introducing an aqueous DNA solution to said coated substrate; and
    allowing said DNA to stretch due to capillary force resulting from the superhydrophilic surface.

2. A process according to claim 1, further comprising the step of depositing a layer of aligned polypyrrole on said superhydrophilic surface.

* * * * *